(12) United States Patent
Herner

(10) Patent No.: US 11,183,534 B2
(45) Date of Patent: Nov. 23, 2021

(54) LIGHT EMITTING DEVICE WITH SMALL FOOTPRINT

(71) Applicant: Scott Brad Herner, Portland, OR (US)

(72) Inventor: Scott Brad Herner, Portland, OR (US)

(73) Assignee: Black Peak LLC, Boulder, CO (US)

( * ) Notice: Subject to any disclaimer, the term of this patent is extended or adjusted under 35 U.S.C. 154(b) by 128 days.

(21) Appl. No.: 16/835,614

(22) Filed: Mar. 31, 2020

(65) Prior Publication Data
US 2021/0305464 A1    Sep. 30, 2021

(51) Int. Cl.
  *H01L 27/15* (2006.01)
  *H01L 25/16* (2006.01)
  *H01L 33/50* (2010.01)
  *H01L 33/10* (2010.01)

(52) U.S. Cl.
  CPC ............ *H01L 27/15* (2013.01); *H01L 25/167* (2013.01); *H01L 33/10* (2013.01); *H01L 33/501* (2013.01)

(58) Field of Classification Search
  CPC ................ H01L 25/167; H01L 27/15–156
  See application file for complete search history.

(56) References Cited

U.S. PATENT DOCUMENTS

| 5,929,477 | A | 7/1999 | Macallister, Jr. et al. |
| 9,425,226 | B2 | 8/2016 | Yamazaki et al. |
| 9,653,479 | B2 | 5/2017 | Miyairi et al. |
| 11,004,895 | B1 * | 5/2021 | Herner ............... H01L 23/5252 |
| 2017/0358503 | A1 * | 12/2017 | Liu ....................... H01L 21/288 |

OTHER PUBLICATIONS

M.A. Haase, J. Xie, T.A. Ballen, J. Zhang, B. Hao, Z.H. Yang, T.J. Miller, X. Sun, T.L. Smith, and C.A. Leatherdale,"II-VI semiconductor color converters for efficient green, yellow, and red light emitting diodes," Applied Physics Letters 96, 231116 (2020).
G. Powch and A. Jain, "Color generation in next generation micro LED displays," LEDInside Jun. 7, 2017.

* cited by examiner

*Primary Examiner* — Zandra V Smith
*Assistant Examiner* — Molly K Reida
(74) *Attorney, Agent, or Firm* — Scott Brad Herner

(57) ABSTRACT

This application describes a light emitting device or an assembly of light emitting devices, each with a small footprint. The light emitting device comprises two transistors, a capacitor, and an LED. The transistors comprise single crystal semiconductor. The capacitor is vertically-oriented. The LED overlies the transistors and capacitor. Methods to form the light emitting device or assembly are discussed.

28 Claims, 31 Drawing Sheets

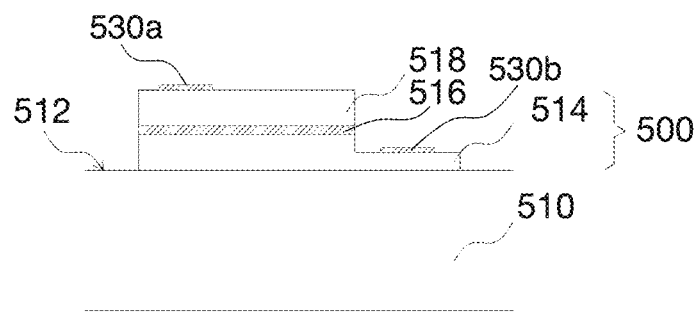
Figure 10A
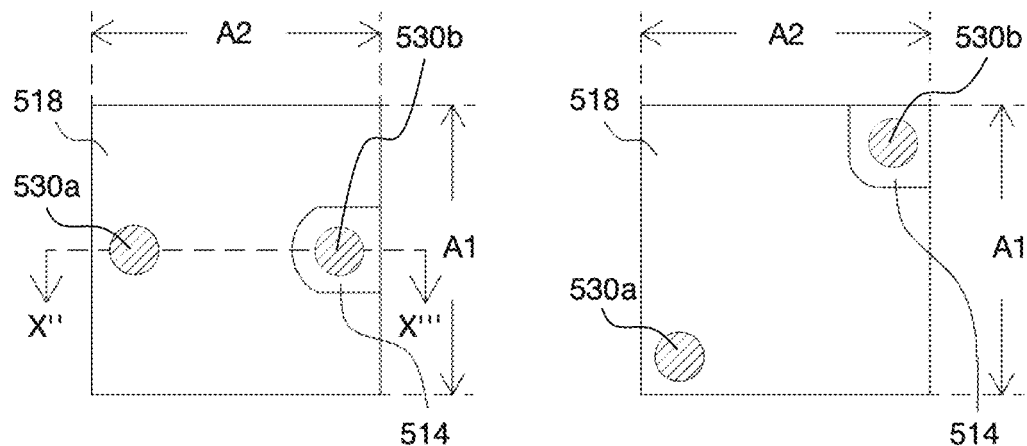
Figure 10B
Figure 10C

A US 11,183,534 B2

LIGHT EMITTING DEVICE WITH SMALL FOOTPRINT

FIELD

The embodiments of the invention are directed generally to light emitting devices having a small footprint. The light emitting device comprises two transistors, a capacitor, and a light emitting diode (LED). The light emitting device with small footprint may be used as a subpixel in a display, or present as a single point light source.

BACKGROUND

Displays may comprise assemblies of pixels. A pixel may comprise three subpixels, each subpixel emitting light of a different dominant wavelength. A subpixel is a light emitting device. The dominant light wavelength emitted by the subpixel corresponds to a color. For example, a pixel may comprise three subpixels emitting red, green, and blue light, respectively. In this case, the pixel can emit light of any color by turning on or off its various subpixels. By controlling the individual brightness of three subpixels emitting red, green, and blue light, the combined light output of these three subpixels may be any color such as pink or cyan. Pixels capable of multicolor light emission may form a color display. A two dimensional array of pixels is a common arrangement for a display. Monochrome displays comprise pixels that emit only one wavelength of light. In the case of monochrome displays, a pixel may comprise only one light emitting device, and so for a monochrome display only, a pixel and subpixel may be the same thing. The subpixel apparatus may be used as part of a color display or a monochrome display, or any other suitable application, for example, single point light sources.

A light emitting device may comprise a light source, such as an LED, and a control apparatus to switch the LED on and off. In a common arrangement for active matrix displays, the control apparatus of a light emitting device may comprise two transistors and a capacitor. The drive transistor controls the brightness of the light emitting device. The address transistor receives a scanning signal to its gate, and the drain of the address transistor is connected to a data line to receive an image data signal. A source terminal is connected to the gate of the drive transistor to control the on/off states of the drive transistor. The source or drain of the drive transistor is connected to an electrode of the LED. The capacitor is connected to the gate of the drive transistor and assists the drive transistor to stay in an on or off state.

When each subpixel in a display is selectively addressed by its individual transistor(s) to change the state of the subpixel, the arrangement is known as an active matrix display. The resolution of a display may be improved by using subpixels with smaller area and/or packing them more closely together. This technique can also be used to shrink the size of a display. Small displays, such as those for watches or augmented reality headsets, require small subpixels. Small subpixels require small LEDs. In a conventional subpixel apparatus, the control devices are placed alongside the LED, with the area of the subpixel being the areas of the control apparatus and the LED, and other associated elements such as interconnects and unoccupied space such as needed for insulating one subpixel from a neighboring subpixel and for manufacturing tolerance. Conventional subpixels also utilize thin film transistors, where the transistor channel comprises a polycrystalline or amorphous semiconductor material with low carrier mobility.

SUMMARY

Embodiments described herein provide for a light emitting device with a small footprint or an assembly of light emitting devices, and methods of fabrication of same. A specific embodiment is for a light emitting device with a transistor substrate having a top surface and bottom surface, wherein the top surface comprises a plurality of conductive regions. There is a plurality of through substrate interconnects in the light emitting device, wherein each through substrate interconnect extends from one of the conductive regions to the bottom surface of the transistor substrate. First and second transistors are formed in the top surface of the transistor substrate. A capacitor has its longest dimension substantially orthogonal to the top surface of the transistor substrate and is in operative communication with the first and second transistors. An LED having a largest area overlies the first and second transistors and capacitor. The LED is in operative communication with either the first or the second transistor. The LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof.

In another embodiment, an assembly of light emitting devices comprises a transistor substrate having a top surface and a bottom surface, wherein the top surface comprises a plurality of conductive regions. The assembly has a plurality of light emitting devices. Each light emitting device comprises a plurality of through substrate interconnects. Each through substrate interconnect extends through the transistor substrate from one of the conductive regions to the bottom surface of the transistor substrate. Each light emitting device comprises a first transistor and a second transistor, both formed in the top surface of the transistor substrate. Each light emitting device comprises a capacitor, wherein the longest dimension of the capacitor is substantially orthogonal to the top surface of the transistor substrate, and wherein the capacitor is in operative communication with the first transistor and the second transistor. Each light emitting device comprises an LED having a largest area and wherein the LED overlies the first and second transistors and the LED. The assembly comprises a plurality of wavelength-converting layers, wherein at least one wavelength-converting layer emits light with a dominant wavelength of between 500 and 550 nm and second wavelength-converting layer emits light with a dominant wavelength of between 610 and 730 nm. The assembly comprises a backboard wherein the backboard comprises a plurality of backboard interconnects.

In another embodiment, a method to fabricate a light emitting device comprises the steps of providing a transistor substrate, the transistor substrate having a top surface and a bottom surface. The top surface of the transistor substrate has a plurality of conductive regions. Two transistors are formed in the top surface of the transistor substrate. A capacitor is formed. An LED is formed on an LED substrate, and the LED has a largest area. The LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof. A reflector layer is formed. The two transistors, capacitor, and transistor substrate are bonded to the LED. After bonding, the reflector layer is disposed between the LED and transistor substrate, the LED is in operative communication with at least one of the two transistors, and the LED overlies the transistors and capacitor. A portion of the original transistor substrate is then removed, and a plurality of through substrate interconnects are formed in the remaining transistor substrate. Each through substrate interconnect extends from a conductive region to the bottom surface of the transistor substrate.

BRIEF DESCRIPTION OF THE DRAWINGS

The drawings are idealized representations to describe embodiments of the present disclosure and are not meant to be actual views of any particular component, structure, or device. The drawings are not to scale, and the thickness and dimensions of some layers may be exaggerated for clarity. Variations from the shapes of the illustrations are to be expected. For example, a region illustrated as a box shape may typically have rough and/or nonlinear features. Sharp angles that are illustrated may be rounded. Like numerals refer to like components throughout. The features, aspects, and advantages of the embodiments described herein will become better understood with regard to the following description, appended claims, and accompanying drawings, where:

FIG. 10A schematically illustrates a cross-sectional view of an LED on an LED substrate.

FIG. 10B schematically illustrates a plan view of the LED shown in FIG. 10A.

FIG. 10C schematically illustrates a plan view of another example of an LED.

DETAILED DESCRIPTION OF EMBODIMENTS

Figure 1:
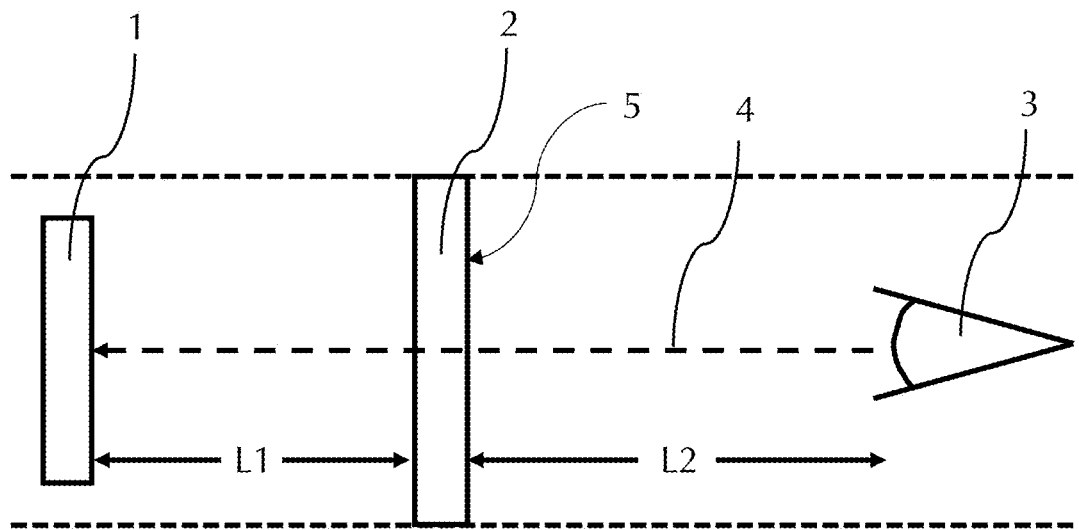
FIG. 1 schematically illustrates an example of a cross-sectional view of one element overlying a second element as seen by a viewer.

It is desirable to reduce the area of the LED in a light emitting device to enable higher resolution in a display and/or a smaller display. For the embodiments in this application, the LEDs will be inorganic semiconductors, and not organic semiconductors. For example, in conventional devices, multiple larger area LEDs may be fabricated on a substrate with an area of over 1000 millimeters squared and then separated into single large-area LED dies measuring 200 microns×200 microns. The large-area LED dies may include a portion of the LED substrate. These large area LED dies may then be mechanically placed into a package with other LED dies, and wire bonded to connect the LEDs to other devices, for example, control devices comprising thin film transistors that are alongside the LED.

Small area LEDs have sometimes been called micro-LEDs. Micro-LEDs may have lateral dimensions of 50 microns×50 microns, 50 microns×20 microns, 20 microns× 20 microns, 10 microns×10 microns, or even smaller. The largest area of a square-shaped LED with dimensions 50 microns×50 microns is 2500 microns squared. The largest area of a square-shaped LED with dimensions 10 microns× 10 microns is 100 microns squared. In this application, micro-LEDs will have a largest area of 2500 microns squared or less. Fabrication of displays using micro-LEDs requires different techniques compared to the fabrication of larger area LEDs. As the LED area shrinks to micro-LED size of 50 microns×50 microns or less, mechanical placement and wire bonding of individual micro LEDs is no longer feasible. New techniques must be employed to assemble micro-LEDs into displays. To decrease the area of the light emitting device and the display, it is advantageous to fit the control apparatus underneath the LED. In embodiments described herein, the control devices fit underneath the LED in the completed light emitting devices. When viewed top-down, the LED will at least partially obscure the control apparatus underneath, and more preferably completely obscures it. To enable the LED to have a small area and yet still fit the control devices underneath, the control apparatus is fabricated in a manner to occupy a small footprint.

Control devices comprising conventional horizontal thin film transistors and horizontal capacitors have a large footprint. Thin film transistors, with polycrystalline or amorphous channels, have lower carrier mobility compared with single crystal transistors, where the channel is single crystal material. For approximately equivalent dimensions and operating voltages, a single crystal transistor will provide a higher current than a thin film transistor due to its higher carrier mobility. In general, a single crystal transistor can provide the same saturation current as a thin film transistor that is many times the size of the single crystal transistor. Some embodiments of the present invention describe a light emitting device with a control apparatus comprising single crystal transistors and vertically-oriented capacitors. LEDs are usually substantially planar devices, having a first surface opposite a second surface. The first and second surfaces are substantially planar and parallel to one another and are separated by a thickness. For example, a substantially planar micro-LED may have first and second polygon surfaces that are square shapes with dimensions of 20 microns×20 microns and a thickness of 2 microns. The largest area of the LED in this example would be 400 microns squared. In conventional displays, a substantially planar LED in a subpixel apparatus may have dimensions of, for example, 200 microns×200 microns, resulting in a largest area of 40,000 microns squared.

Embodiments of the present invention will employ vertically-oriented capacitors that have the longest dimension substantially orthogonal to the planar transistor substrate, minimizing the footprint of the capacitor. In contrast, horizontally-oriented capacitors have their longest dimension parallel to the transistor substrate. The embodiments of the present invention have single crystal transistors with interconnects extending through the single crystal transistor substrate. Another benefit to fitting the control devices underneath the substantially planar LED is the reduction in resistance losses that comes with short interconnection between the LED and the control devices that is a result of stacking the LED over the control devices.

Fabrication methods for inorganic LEDs and their control devices are different than for organic LEDs and their control devices. Inorganic LEDs comprising materials such as but not limited to gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof are fabricated on single crystal LED substrates. These single crystal LED substrates serve as a template or seed, so that the LED fabricated upon them is substantially single crystal as well. Single crystal LED substrates, for example, silicon, sapphire, or silicon carbide, are typically more than 400 microns thick during LED fabrication, to enable a large surface that is mechanically robust on which to economically fabricate many thousands of LEDs simultaneously. Inorganic single crystal LED fabrication occurs at high temperatures, typically over 850° C., and often over 1000° C., for a duration lasting 30 minutes or more. The control apparatus for the LEDs includes transistors. Exposing transistors to thermal cycles in excess of 850° C. for 30 minutes or longer will degrade or even ruin the desired electrical properties of many types of transistors. Therefore, fabricating inorganic LEDs on substrates comprising transistors is not practical. Light emitting devices with inorganic LEDs are made by forming the LEDs on an LED substrate at high temperatures, forming the control apparatus on a separate transistor substrate, and then combining the LED and control apparatus. In this manner the control apparatus is not exposed to the high temperatures necessary for inorganic LED fabrication. In contrast, organic LEDs, comprising such materials as poly(3,4-ethylenedioxythiophene) poly(styrenesulfonate), commonly known as PEDOT:PSS, are typically fabricated at temperatures of 200° C. or less. Temperatures of 200° C. or less have relatively little effect on the electrical properties many types of transistors. Therefore, it is practical to fabricate organic LEDs on substrates with transistors and avoiding a separate combining step.

Figure 2:
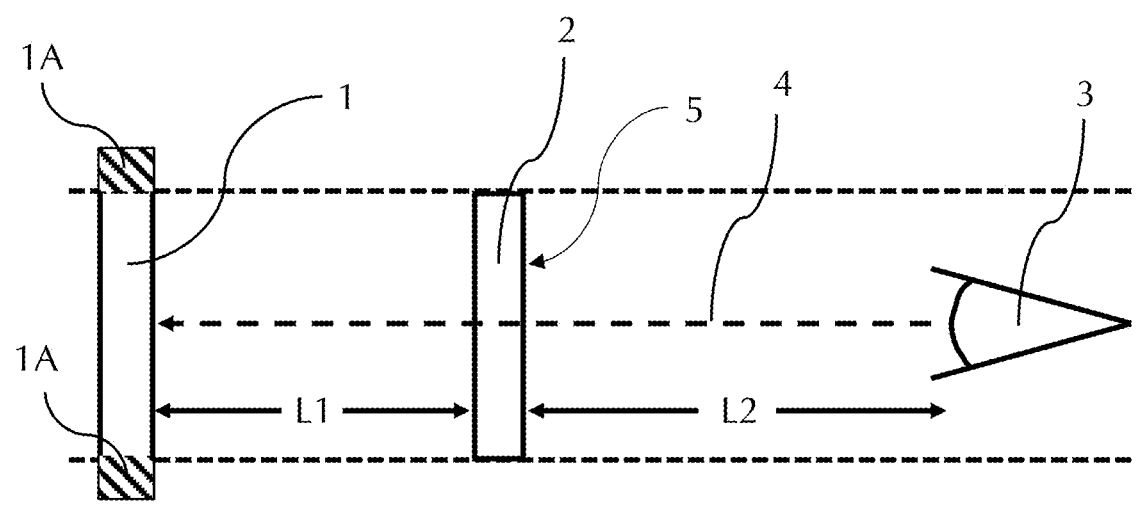
FIG. 2 schematically illustrates an example of a cross-sectional view of one element overlying a second element as seen by a viewer.
Figure 3:
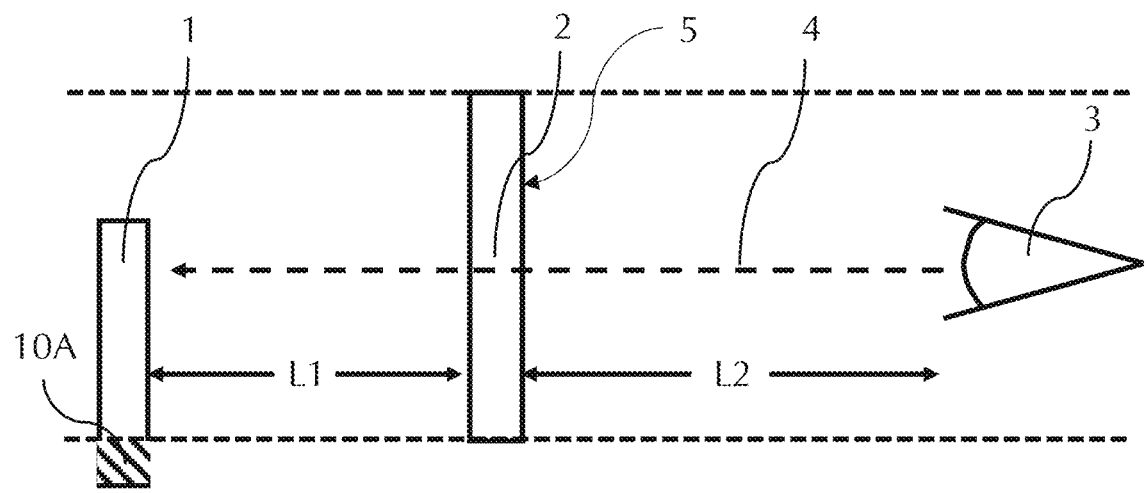
FIG. 3 schematically illustrates an example of a cross-sectional view of one element overlying a second element as seen by a viewer.
Figure 4:
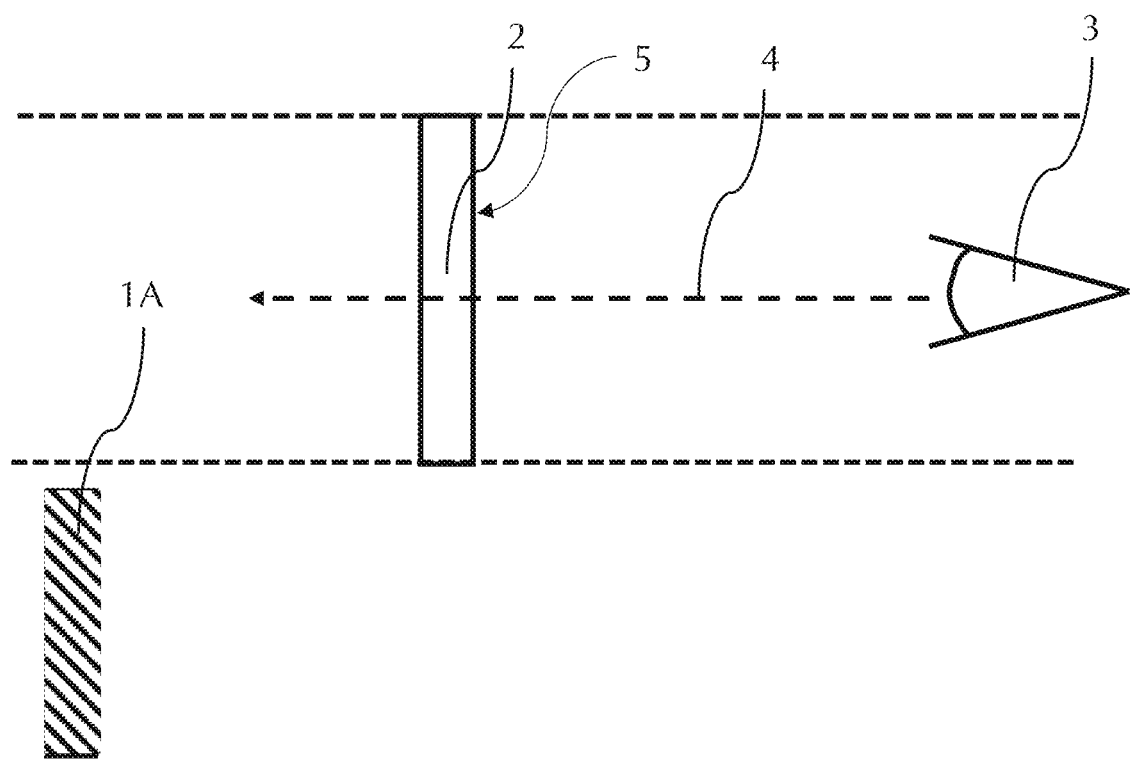
FIG. 4 schematically illustrates an example of a cross-sectional view of two elements as seen by a viewer.

As used herein, the term "overlying" describes a second element that at least partially obscures a first element or elements when the second element is between the first element or elements and a viewer. The term "underlying" describes a first element or elements that is or are at least partially obscured by a second element when the second element is between a viewer and the first element or elements. The viewer is on a line orthogonal to the center of the surface of the second element facing the viewer of the second element. As shown by example in FIG. 1, a second element 2 overlies a first element 1 because second element 2 lies between first element 1 and a viewer 3, and second element 2 obscures first element 1 from viewer 3. In FIGS. 1-3, the dimension L2 is the distance between viewer 3 and second element 2, and the dimension L1 is the distance between element 1 and element 2. The ratio of L2 to L1 is at least 100×. In one example, dimension L2 is 2 meters and dimension L1 is 2 microns, and the ratio L2/L1 is 1,000,000×. In FIGS. 1-4, the surface 5 is the surface of the second element facing viewer 3, and line 4 is orthogonal to the surface 5 and transits the center of surface 5. First element 1 underlies second element 2 in FIG. 1. First element 1 is completely obscured from viewer 3 by second element 2 in FIG. 1. In another example shown in FIG. 2, a second element 2 overlies a first element 1 because second element 2 lies between first element 1 and viewer 3, and second element 2 obscures first element 1 from viewer 3. First element 1 underlies second element 2. In this example, the first element 1 is partially obscured by second element 2 from viewer 3, with portion 1A of first element 1 that does not underlie second element 2. In another example shown in FIG. 3, a second element 2 overlies a first element 1 because second element 2 lies between first element 1 and a viewer 3 and second element 2 obscures first element 1 from viewer 3. First element 1 underlies second element 2. In this example, the first element 1 is partially obscured by second element 2 from viewer 3, with portion 1A of first element 1 that does not underlie second element 2. In another example shown in FIG. 4, a second element 2 does not overlie a first element 1 because second element 2 does not obscure first element 1 from a viewer 3.

When an element is referred to being "directly on" on another element, there are no intervening elements present. As used herein, the phrase "operative communication" describes a functional connection. As used herein, the phrase "largest area" refers to the largest area or largest areas of multiple areas that enclose a solid element. There may be more than one largest area. For example, a box enclosed by squares of equal length sides will have six largest areas, all equal in size. As used herein, the phrase "longest dimension" refers to the largest dimension of an object, wherein the object has a size defined by its three dimensions in the X-Y-Z Cartesian coordinate system. The largest dimension will be substantially parallel to one of the X, Y, or Z axes. Particular features described herein can be used in combination with other described features in each of the variously possible combinations and permutations.

In this application, some embodiments of a light emitting device or an assembly of light emitting devices are described. In a first embodiment, a light emitting device is described comprising two single crystal transistors and a stack capacitor underlying a substantially planar LED with one LED vertical interconnect. In a second embodiment, a light emitting device is described comprising two single crystal transistors and a stack capacitor underlying a substantially planar LED with two LED vertical. In a third embodiment, a light emitting device is described comprising two single crystal transistors and a trench capacitor underlying a substantially planar LED with one LED vertical interconnect. In a fourth embodiment, a light emitting device is described comprising two single crystal transistors and a trench capacitor underlying a substantially planar LED with two LED vertical interconnects. Other embodiments further comprising reflector layers and/or wavelength converting layers are described. Examples of methods to fabricate a light emitting device are described, along with the function of the elements. Finally, some embodiments of assemblies of light emitting devices will be described.

Figure 5:
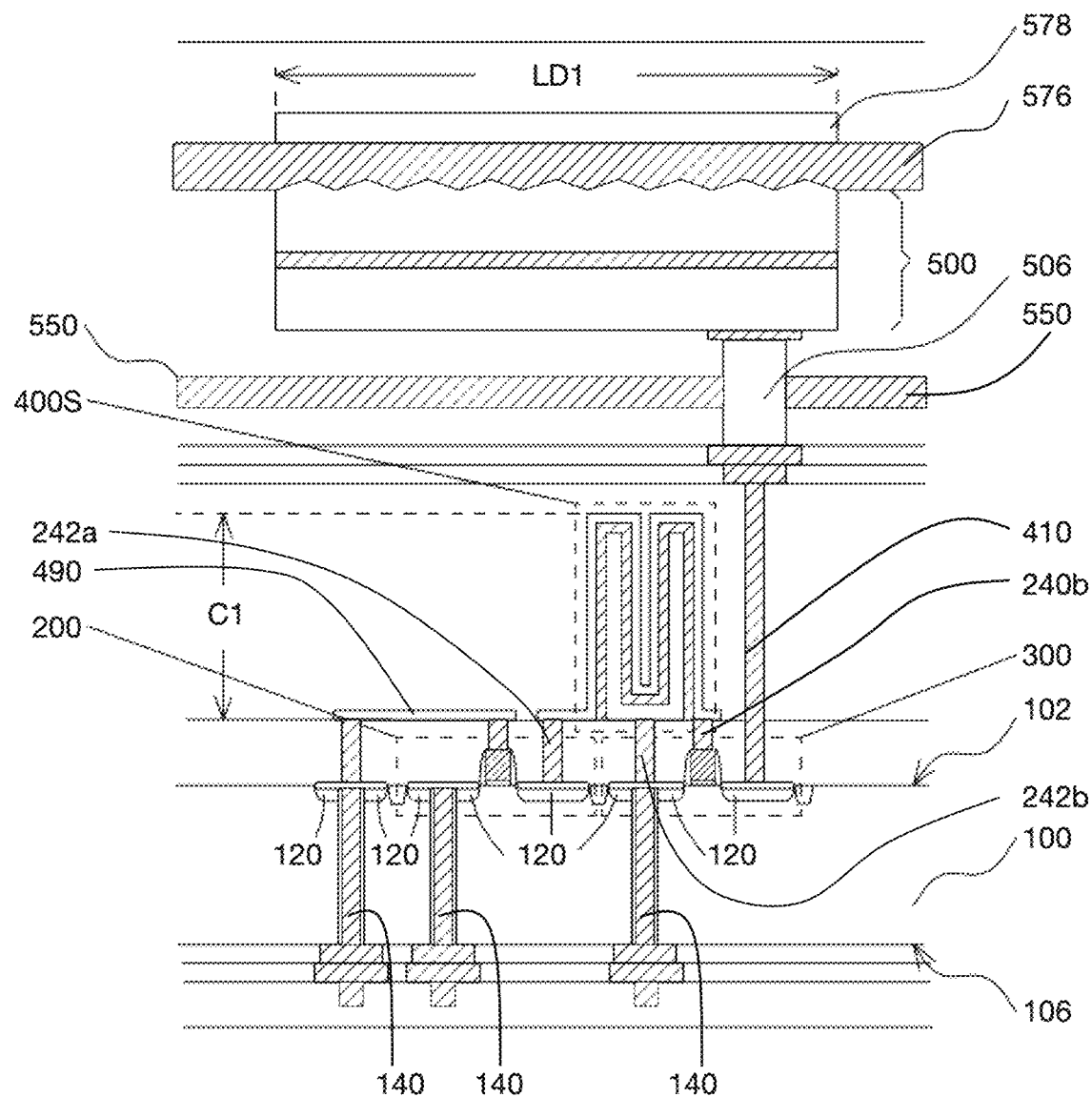
FIG. 5 schematically illustrates a cross-sectional view of one embodiment of a light emitting device with two single crystal transistors and a stack capacitor underlying an LED with one LED vertical interconnect.

Turning to FIG. 5, an embodiment of a light emitting device is shown in cross-sectional view. The light emitting device comprises a transistor substrate 100 having a top surface 102 and a bottom surface 106. Top surface 102 and bottom surface 106 are planes that extend through the page. Top surface 102 comprises a plurality of conductive regions 120. Conductive regions 120 are shown as areas but are in reality volumes that extend through the page like all of the elements of the light emitting device when shown in cross-section. The light emitting device comprises a first transistor 200 and second transistor 300, both of which are formed in transistor substrate 100. The light emitting device also comprises a capacitor 400S. Capacitor 400S is a stack capacitor having a longest dimension C1. In other embodiments (not shown), capacitor 400S may be a planar capacitor. Dimension C1 is substantially orthogonal to top surface 102 of transistor substrate 100. The light emitting device also comprises an LED 500 that is substantially planar. LED 500 has dimension LD1 and another dimension extending orthogonally through the page (not shown) that defines the largest area of LED 500. The largest area of LED 500 overlies first transistor 200, second transistor 300, and capacitor 400S. The thickness of LED 500 as well as the roughness of one of its surfaces has been exaggerated for clarity. LED 500 comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof. A plurality of through substrate interconnects 140 extend from conductive regions 120 to the bottom surface 106 of transistor substrate 100. A single LED vertical interconnect 506 is in contact with LED 500. A transparent conductive layer 576 is also in contact with LED 500. In this embodiment, capacitor 400S is a stack capacitor and is disposed between second transistor 300 and LED 500. Capacitor 400S is in operative communication with first transistor 200 and second transistor 300 through transistor vertical interconnects 242a, 242b, and 240b. LED 500 is in operative communication with second transistor 300 through LED vertical interconnect 506 and transistor vertical interconnect 410. A reflective layer 550 is disposed between LED 500 and transistor substrate 100. A wavelength-converting layer 578 overlies LED 500. The areas between transistors 200 and 300, capacitor 400S, and between these devices and LED 500 which are not occupied by interconnects, reflector layers, or wavelength-converting layers are occupied with dielectric material, for example, silicon oxide (not shown).

Other embodiments of this device may not have a reflective layer 550 or wavelength-converting layer 578.

Figure 6:
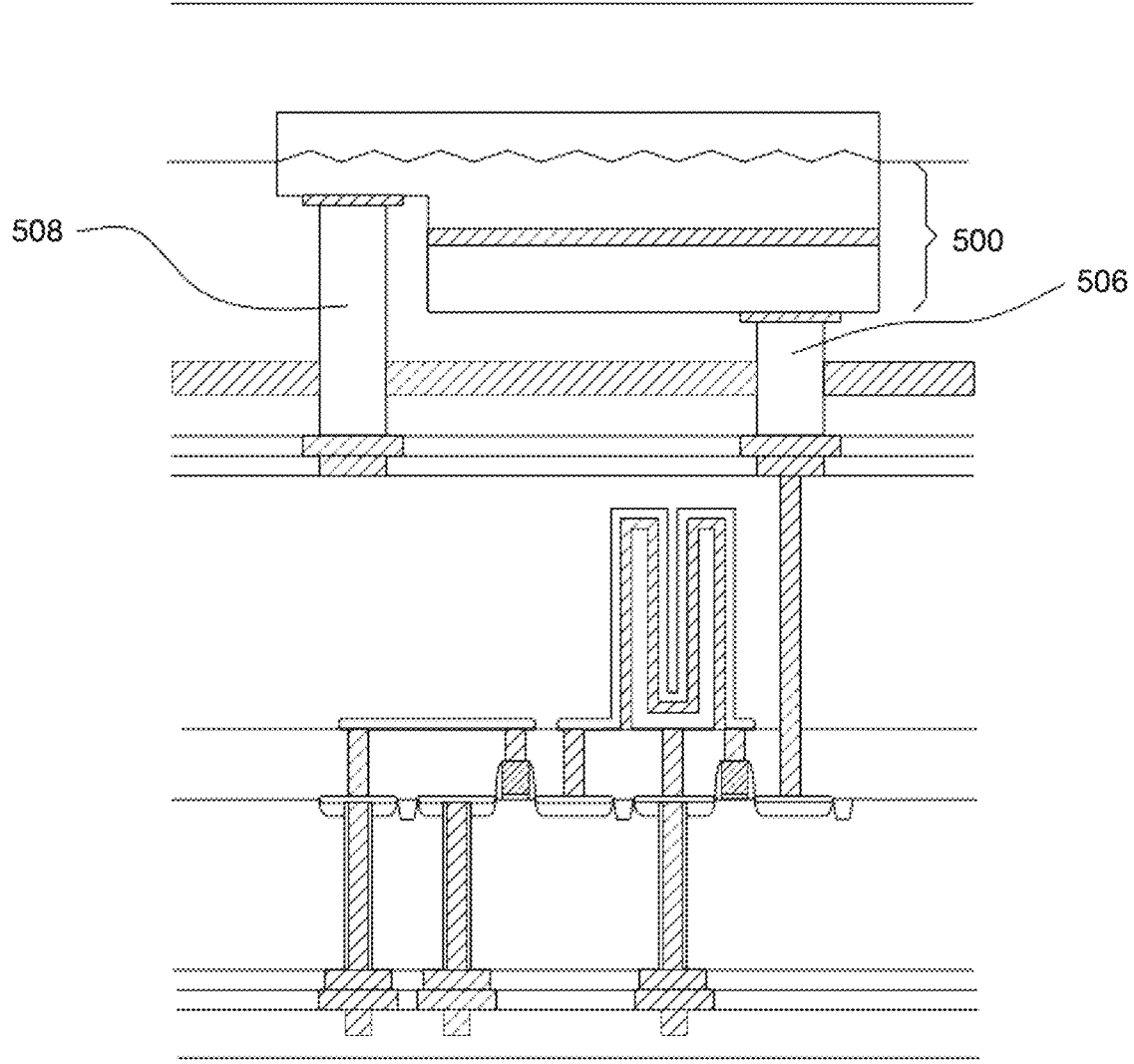
FIG. 6 schematically illustrates a cross-sectional view of one embodiment of a light emitting device with two single crystal transistors and a stack capacitor underlying an LED with two LED vertical interconnects.

Turning to FIG. 6, a different embodiment of a light emitting device is shown in cross-sectional view. The light emitting devices comprises most of the same elements shown in FIG. 5, except LED 500 has two LED vertical interconnects 506 and 508 contacting it. There will be a more detailed discussion of LED fabrication, including plan views, in a later section.

Figure 7:
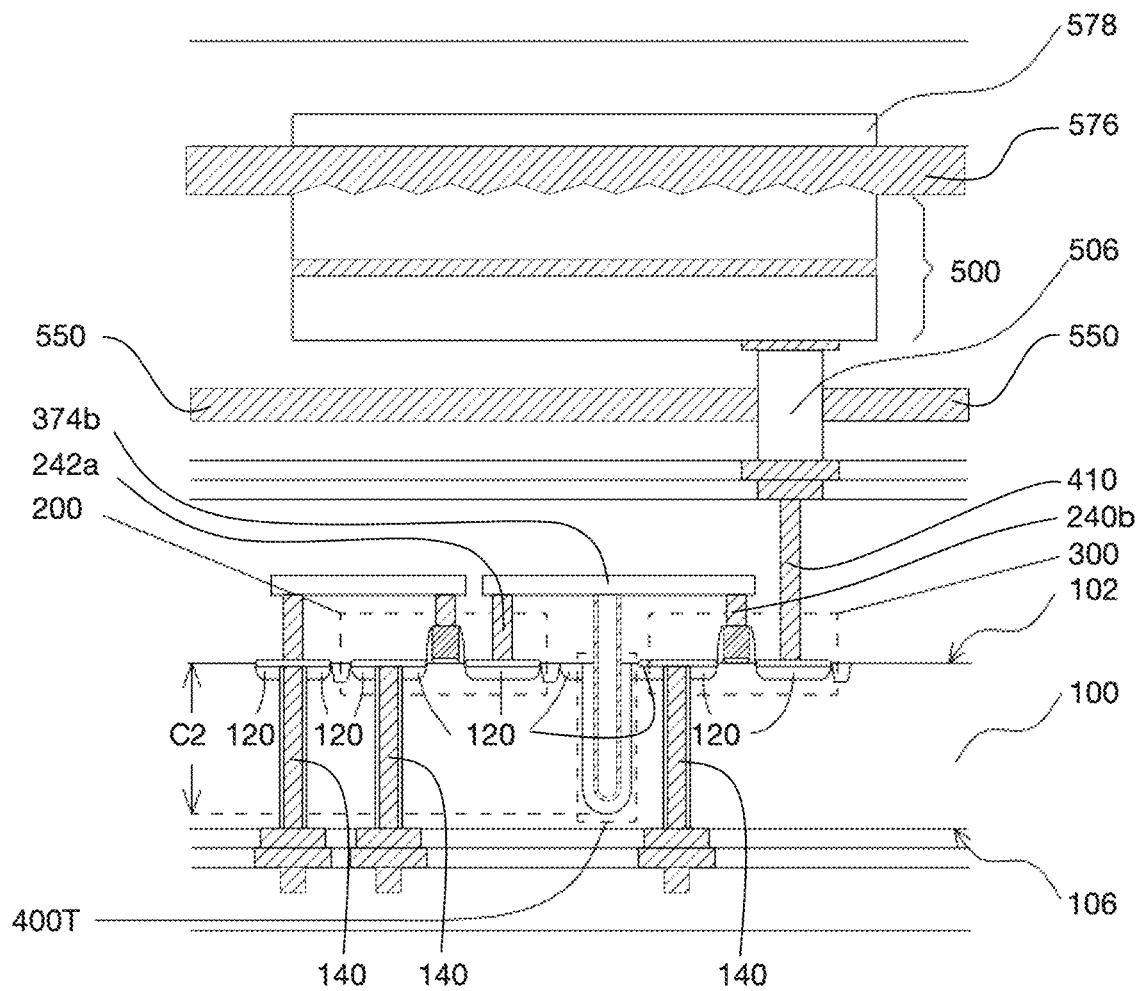
FIG. 7 schematically illustrates a cross-sectional view of one embodiment of a light emitting device with two single crystal transistors and a trench capacitor underlying an LED with one LED vertical interconnect.

Turning to FIG. 7, a different embodiment of the present invention is shown in cross-sectional view. The light emitting device comprises a transistor substrate 100 having a top surface 102 and a bottom surface 106. Top surface 102 comprises a plurality of conductive regions 120. The light emitting device comprises a first transistor 200 and second transistor 300, both of which are formed in transistor substrate 100. The light emitting device also comprises a capacitor 400T. Capacitor 400T is a trench capacitor having a longest dimension C2, and at least a portion of capacitor 400T is disposed between top surface 102 and bottom surface 106 of transistor substrate 100. In other embodiments (not shown), capacitor 400T may be a planar capacitor. Dimension C2 is orthogonal to top surface 102 of transistor substrate 100. The light emitting device also comprises an LED 500 that is substantially planar, and has a largest area overlying first transistor 200, second transistor 300, and capacitor 400T. LED 500 comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof. A plurality of through substrate interconnects 140 extend from conductive regions 120 to the bottom surface 106 of transistor substrate 100. A single LED vertical interconnect 506 is in contact with LED 500. A transparent conductive layer 576 is also in contact with LED 500. Capacitor 400T is in operative communication with first transistor 200 and second transistor 300, through transistor vertical interconnects 242a and 240b, horizontal interconnect 374b, and conductive region 120. LED 500 is in operative communication with second transistor 300 through LED vertical interconnect 506 and transistor vertical interconnect 410. A reflective layer 550 is disposed between LED 500 and transistor substrate 100. A wavelength-converting layer 578 overlies LED 500. The areas between transistors 200 and 300, capacitor 400T, and between these devices and LED 500 which are not occupied by interconnects, reflector layers, or wavelength-converting layers are occupied with dielectric material, for example, silicon oxide, not shown. Other embodiments of this device may not have a reflective layer 550 or wavelength-converting layer 578.

Figure 8:
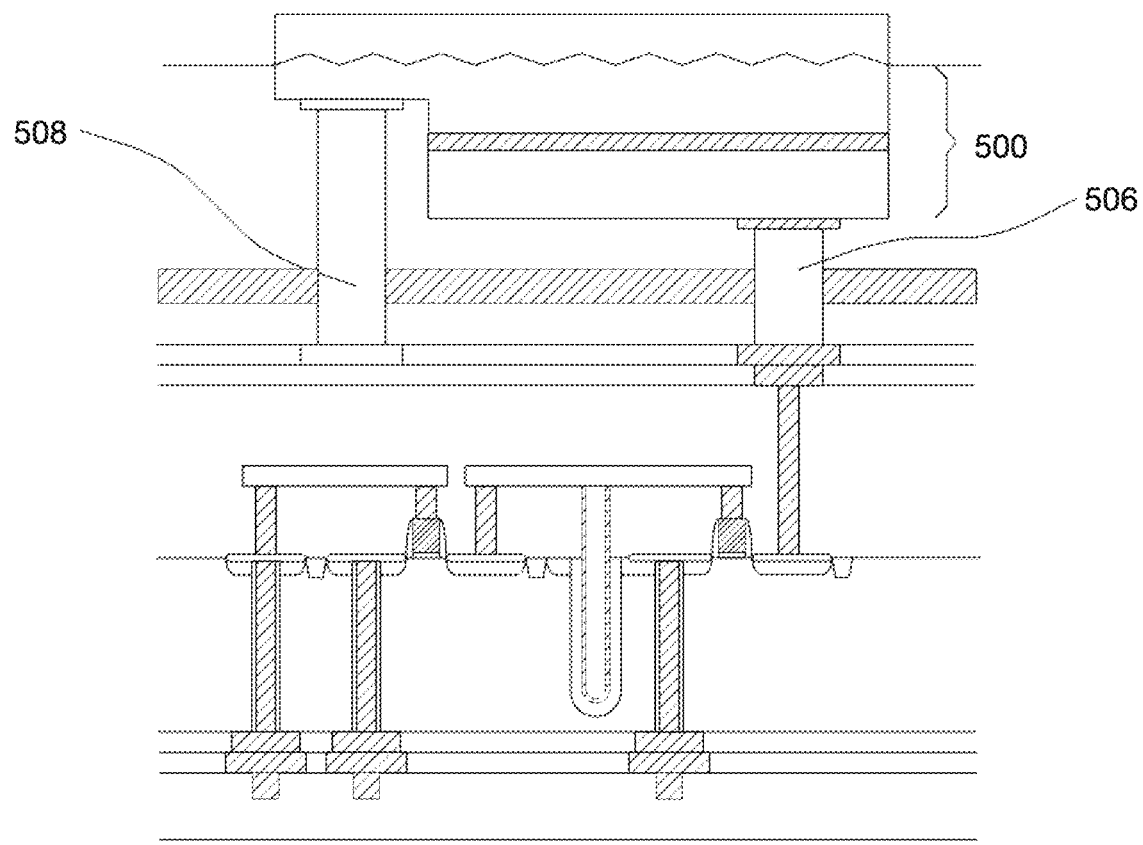
FIG. 8 schematically illustrates a cross-sectional view of one embodiment of a light emitting device with two single crystal transistors and a trench capacitor underlying an LED with two LED vertical interconnects.

Turning to FIG. 8, a different embodiment of a light emitting device is shown in cross-sectional view. The light emitting device comprises most of the same elements shown in FIG. 7, except LED 500 has two LED vertical interconnects 506 and 508 contacting it.

I. Single Light Emitting Device Fabrication

Some embodiments of the fabrication of a single light emitting device and the function of its elements will be discussed in section I. The LED and fabrication will be described in subsection IA. LED fabrication will occur on an LED substrate, although the LED substrate will be removed in a subsequent step. The LED, LED substrate, and associated elements such as passivating dielectric layers, LED vertical interconnects, and a bond pad layer will collectively be called the LED apparatus. The transistors and their fabrication will be described in subsection IB. The stack capacitor and its fabrication will be described in subsection IC. The trench capacitor and its fabrication will be described in subsection ID. The transistors and capacitor will be fabricated on a transistor substrate. The transistors, capacitor, transistor substrate, and associated elements such as passivating dielectric layers and transistor vertical interconnects, and a bond pad layer will collectively be called the control apparatus. A bonding process will join the control apparatus with the LED apparatus, as described in subsection IE Next, through substrate interconnects extending from conductive regions of the transistor substrate and fabrication methods will be described in subsection IF. The bonding of the combined LED apparatus, control apparatus, and through substrate interconnects to a backboard will be described in subsection IG. Finally, the formation of wavelength-converting layers will be described in section IH Some embodiments of an assembly of light emitting devices comprising multiple light emitting devices will be discussed in section II.

Some examples of methods to fabricate embodiments according to the present invention will be discussed. When reference is made herein to a method comprising two or more defined steps, the defined steps can be carried out in any order or simultaneously (except where context or specific instruction excludes that possibility), and the method can include one or more other steps carried out before any of the defined steps, between two of the defined steps, and/or after all the defined steps (except where context excludes that possibility). The fabrication processes described herein do not form a complete process flow, with the remainder of the process flow known to those of ordinary skill in the art. Only the methods and structures necessary to understand embodiments of the present invention are described herein.

IA. LED Apparatus

Figure 9A:
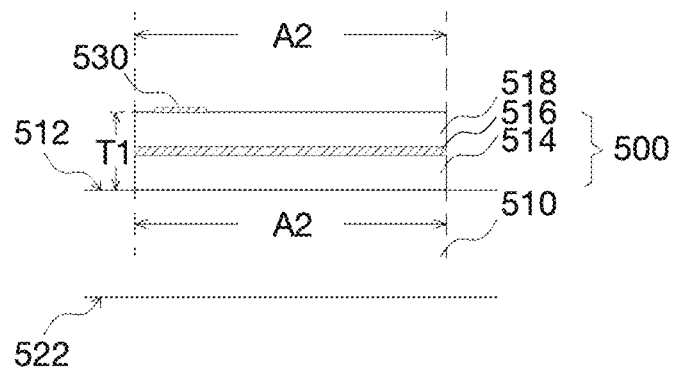
FIG. 9A schematically illustrates a cross-sectional view of an LED on an LED substrate.

One embodiment of the LED apparatus and fabrication is now described. It is to be understood that fabrication of many LED apparatus is occurring simultaneously on the same LED substrate although only one is shown. Turning to FIG. 9A, an LED 500 is formed on an LED substrate 510. LED 500 comprises a first conductive layer 514 which is disposed on the surface 512 of LED substrate 510, an active layer 516 disposed on first conductive layer 514, and a second conductive layer 518 disposed on active layer 516. Surface 512 is one surface of LED substrate 510, which has another substantially parallel surface 522. In this embodiment, an LED contact 530 is disposed on a portion of second conductive layer 518. In this embodiment, each of layers 514, 512, and 518 is in immediate contact with the layer below it, with no intervening layers.

First conductive layer 514 and second conductive layer 518 may be any suitable semiconductor layer known to those skilled in the art, including but not limited to gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide. The first and second conductive layers 514 and 518 may be gallium nitride doped to opposite polarity of one another, for example, n-type and p-type or vice versa. Active layer 516 may be fabricated of any standard semiconductor materials, for example indium gallium nitride, in any formation, for example single quantum well, multiple quantum wells, or double heterostructure. In other embodiments, there may be so-called current blocking layers (not shown) above and/or below active layer 516 (i.e. the active layer 516 may be deposited on a current blocking layer, and a current blocking layer may be deposited on active layer 516). The principles and mechanisms of the conductive and active layers are well known to those skilled in the art. Any suitable method may be used to deposit LED semiconducting materials, including but not limited to metal organic chemical vapor deposition (MOCVD), hydride vapor phase epitaxy, molecular beam epitaxy, most preferably MOCVD.

LED substrate 510 upon which LED 500 is fabricated is any suitable single crystal semiconductor, although any suitable substrate material may be used, including but not limited to sapphire, silicon carbide, gallium nitride, zinc oxide, and silicon. LED substrate 510 comprises single crystal material which is substantially crystal lattice matched with the first conductive layer 514. Substantially crystal lattice matched is to mean the mismatch between the two crystal lattices is less than about 25%. For example, gallium nitride and sapphire are substantially crystal lattice matched, with a lattice mismatch of 16%.

LED contact 530 may be any suitable material to make an ohmic contact to conductive layer 518, including but not limited to indium tin oxide (ITO), aluminum zinc oxide (AZO), fluorine-doped tin oxide (FTO), aluminum, silver, nickel, or a stack of a nickel layer followed by a gold layer. LED contact 530 may be deposited by any suitable technique, such as evaporation, CVD, or sputtering, most preferably evaporation. LED contact 530 may have been formed by etching a larger layer with a masking layer disposed on it (not shown), or by a lift-off technique. The masking layer is removed (not shown).

Figure 9B:
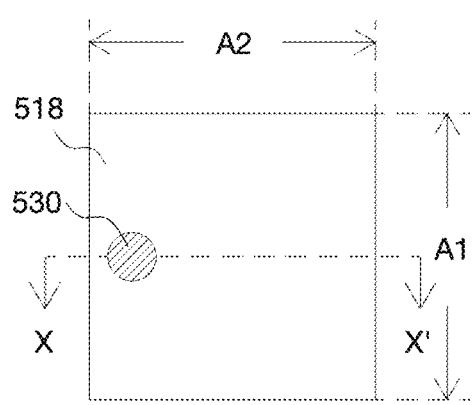
FIG. 9B schematically illustrates a plan view of the LED shown in FIG. 9A.
Figure 9C:
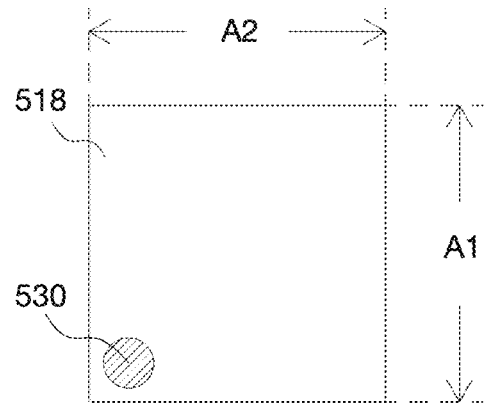
FIG. 9C schematically illustrates a plan view of another example of an LED.

FIGS. 9B and 9C are schematic plan view illustrations of some embodiments of LEDs. FIG. 9B is a plan view of LED 500 with cross section X-X' in FIG. 9A. LED 500 in FIG. 9A has LED contact 530 near one of the middle edges of conductive layer 518. An example of a different placement of the LED contact is shown in FIG. 9C. FIG. 9C is a plan view schematic of a different LED, with LED contact 530 in one corner of conductive layer 518. While LED contact 530 is shown in FIGS. 9B and 9C as round, it may have any suitable shape, for example round with current spreading lines emanating from the round shape. In one example, LED contact 530 may have a diameter of 1 micron in plan view, although any suitable size may be used. While FIGS. 9B and 9C both show square-shaped LEDs in plan view, the LEDs may take any suitable shape in plan view, such as rectangular, triangular, or any other polygon. In the present invention, dimensions A1 and A2 in FIGS. 9A and 9B may be 50 microns, 10 microns, 5 microns, or even smaller values. The largest area of LED 500 is the largest area, i.e. the top or bottom, of the first conductive layer 514. As shown in FIGS. 9A-C, the first conductive layer 514 is a square shape with a thickness T1, thickness T1 being much smaller than dimensions A1 or A2. The thickness T1 is exaggerated in FIG. 9A for clarity. The surface area of the LED 500 is dimension A1 multiplied by dimension A2. In this embodiment, dimensions A1 and A2 are the same for first conductive layer 514 and second conductive layer 518. The resulting largest area of LED 500 may be 2,500 square microns, 1,000 square microns, 100 square microns, or even smaller values. The present invention is directed towards LEDs with largest areas less than or equal to 2,500 square microns. In another example, the dimensions A1 and A2 are 10 microns, resulting in an LED largest area of 100 square microns.

Turning to FIG. 10A, an alternative embodiment for LED fabrication is illustrated. Referring to FIG. 10A, LED 500 is formed on LED substrate 510 and is shown schematically in cross section. LED 500 comprises a first conductive layer 514 which is disposed on the surface 512 of LED substrate 510, an active layer 516 disposed on first conductive layer 514, and a second conductive layer 518 disposed on active layer 516. In this embodiment, an LED contact 530a is disposed on a portion of second conductive layer 518, and another LED contact 530b is disposed on a portion of first conductive layer 514. It is to be understood that this can represent one of many LEDs on LED substrate 510.

FIGS. 10B and 10C are schematic plan view illustrations of some embodiments of LEDs. FIG. 10B is a plan view of LED 500 with cross section X"-X'" in FIG. 10A. LED 500 has LED contacts 530a and 530b near one of the middle edges of conductive layer 518 and conductive layer 514, respectively. An example of a different placement of the LED contact is shown in FIG. 10C. FIG. 10C is a plan view schematic of a different LED, with LED contact 530a in one corner of conductive layer 518. While LED contact 530 is shown in FIGS. 10B and 10C as round, it may have any suitable shape, for example round with current spreading lines emanating from the round shape. In one example, LED contact 530 may have a diameter of 1 micron in plan view, although any suitable size may be used. While FIGS. 10B and 10C both show square-shaped LEDs in plan view, the LEDs may take any suitable shape in plan view, such as rectangular, triangular, or any other polygon. In the present invention, dimensions A1 and A2 in FIGS. 10A and 10B may be 200 microns, 10 microns, 5 microns, or even smaller values. The largest area of LED 500 is the largest area, i.e. either the top or the bottom, of the first conductive layer 514. The surface area of the LED 500 is dimension A1 multiplied by dimension A2. In this embodiment, first conductive layer 514 has a largest area that is larger than that of second conductive layer 518. The resulting largest area of LED 500 may be 2,500 square microns, 1,000 square microns, 100 square microns, or even smaller values. The present invention is directed towards LEDs with small largest areas less than or equal to 2,500 square microns. In another example, the dimensions A1 and A2 are 5 microns, resulting in an LED largest area of 25 square microns.

Figure 11A:
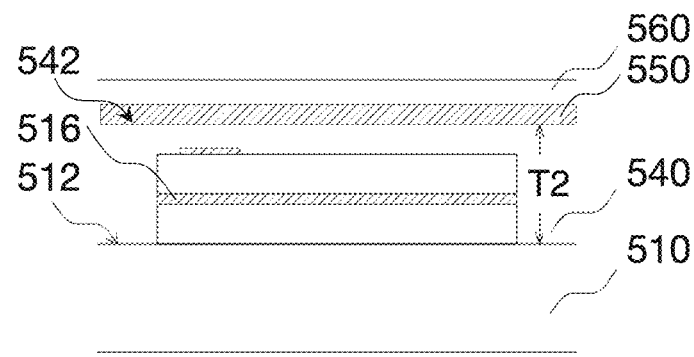
FIG. 11A schematically illustrates a cross-sectional view of an LED with a reflector layer.

Turning to FIG. 11A, a first dielectric layer 540 is disposed on LED 500 and LED substrate 510 as shown in cross section. First dielectric layer 540 may be any suitable material, including but not limited to silicon oxide, aluminum oxide, titanium oxide, silicon nitride, or combinations thereof, most preferably silicon oxide. First dielectric layer 540 is substantially transparent to light of the wavelength emitted by active layer 516. Substantially transparent is to mean at least 70% of the light is transmitted through the layer. First dielectric layer 540 can be deposited by any suitable technique, such as evaporation, sputtering, CVD, or spin-on techniques, most preferably by CVD. After deposition, first dielectric layer 540 may be planarized. Planarization is the process by which the top surface 542 of first dielectric layer 540 is rendered substantially parallel to surface 512 of LED substrate 510. Planarization may be accomplished by any suitable technique, including but not limited to chemical mechanical planarization (CMP), wet chemical etch, or plasma etch in corrosive gas, most preferably by CMP. Subsequent steps in fabrication will be described assuming that first dielectric layer 540 of FIG. 11A has been planarized. It is to be understood that the fabrication could proceed without this planarizing step. The thickness of first dielectric layer 540 is dimension T2 measured between surface 512 and surface 542. Thickness T2 can be between 0.05 and 100 microns, most preferably about 3 microns.

A reflector layer 550 is disposed on surface 542 of first dielectric layer 540. Reflector layer 550 will direct more of the light emitted by LED 500 towards the viewer in the finished light emitting device. In a later step, this structure will be inverted in the final completed device. Reflector layer 550 may comprise any suitable material that substantially reflects visible light of the wavelength emitted by active layer 516 including but not limited to aluminum, gold, or silver, alloys of aluminum, gold, or silver, a composite material such as a polymer mixed with metal oxide particles, combinations thereof, or a distributed Bragg reflector (DBR), most preferably a DBR. A DBR includes one or more pairs of dielectric layers (not shown). Each dielectric layer in a pair has a different index of refraction. The dielectric layers of the DBR may be deposited by any suitable method, including evaporation, sputtering, CVD, or ALD, most preferably by evaporation. The thickness of each dielectric layer in the DBR is designed to be about one quarter of the wavelength of light that is to be reflected. The wavelength of light varies with the index of refraction of each material. For example, for an active layer of an LED that emits blue light with a wavelength from 440 to 460 nm, a suitably reflective DBR would be comprised of one to ten, most preferably five, pairs of aluminum oxide (index of refraction is 1.5 to 1.7) and titanium oxide (index of refraction is 2.3 to 2.7) layers, where the aluminum oxide layer is 67±7 nm thick and the titanium oxide layer is 49±5 nm thick. A reflector layer 550 that is a DBR may comprise silicon oxide, silicon nitride, aluminum oxide, tantalum oxide, or titanium oxide, or any other suitable dielectric materials. In other embodiments, a reflector layer is not disposed on first dielectric layer 540. Subsequent steps in the fabrication will be described assuming the reflector layer 550 exists. While reflector layer 550 is shown as a continuous layer in FIG. 11A, it is to be understood that the reflector layer 550 may not be continuous in all embodiments, and there may be multiple reflector layers in other embodiments.

Figure 11B:
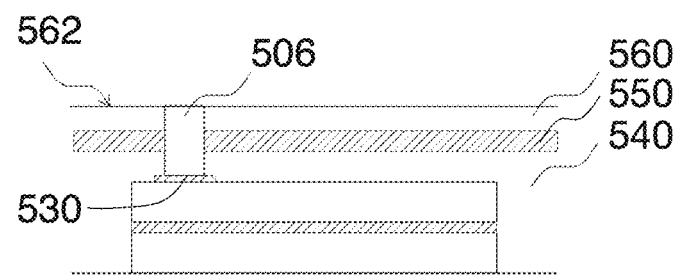
FIG. 11B schematically illustrates a cross-sectional view of an LED with a reflector layer and a single LED vertical interconnect.

Turning to FIG. 11B, a second dielectric layer 560 is disposed on reflector layer 550. Second dielectric layer 560 may be any suitable material, including but not limited to silicon oxide, aluminum oxide, titanium oxide, silicon nitride, or combinations thereof, most preferably silicon oxide. Second dielectric layer 560 can be deposited by any suitable means, such as evaporation, sputtering, CVD, or spin-on techniques, most preferably by CVD. The thickness of second dielectric layer 560 may be between 0.05 and 10 microns, most preferably about 0.2 microns.

Next, an LED vertical interconnect is formed. A masking layer such as photoresist (not shown) is applied and patterned, and portions of layers 560, 550, and 540 are removed by etching in specific locations. At least a portion of LED contact 530 is exposed after this etch is complete. The etching may be accomplished by any suitable etchant, such as corrosive gases like $CHF_3$, $SF_6$, HBr, or wet chemical acid, such as hydrofluoric acid (HF), nitric acid ($HNO_3$), or sulfuric acid ($H_2SO_4$), most preferably by corrosive gas. The masking layer is then removed, leaving a cavity. LED vertical interconnect 506 is then formed in the cavity. In one embodiment, LED vertical interconnect 506 is cylinder-shaped, with the diameter of the cylinder in contact with LED contact 530, although any suitable shape may be used. In one example, the diameter of LED vertical interconnect 506 is 0.8 microns, although any suitable size may be used. LED vertical interconnect 506 may comprise any suitable material which is conductive, including but not limited to ITO, AZO, FTO, or a conductive polymer such as Poly(3, 4-ethylenedioxythiophene, or PEDOT), titanium, titanium nitride, tungsten, tantalum, tantalum nitride, copper, or aluminum. LED vertical interconnect 506 forms a substantially ohmic contact to LED contact 530. LED vertical interconnect 506 may be deposited by any suitable technique, including but not limited to evaporation, CVD, sputtering, solution deposition, or spray pyrolysis, most preferably CVD. Portions of LED vertical interconnect 506 that are deposited on surface 562 of second dielectric layer 560 may be removed by any suitable technique, including but not limited to CMP, wet chemical etch, or plasma etch in corrosive gas, most preferably by CMP.

Figure 11C:
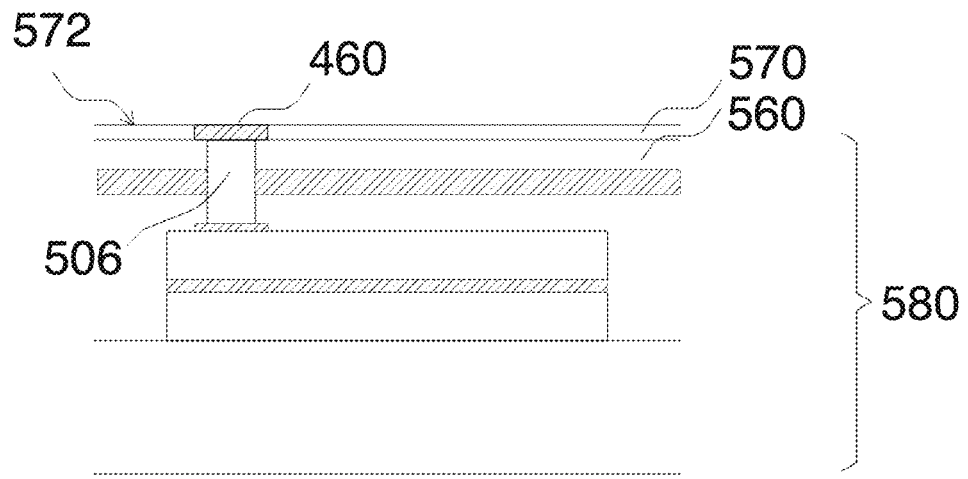
FIG. 11C schematically illustrates a cross-sectional view of an LED apparatus with an LED, a reflector layer, a single LED vertical interconnect, and a bond pad layer.

Turning to FIG. 11C, a third dielectric layer 570 is deposited on second dielectric layer 560. Third dielectric layer 570 may be any suitable material, such as silicon oxide, aluminum oxide, titanium oxide, silicon nitride, or combinations thereof, most preferably silicon oxide. Third dielectric layer 570 can be deposited by any suitable means, such as evaporation, sputtering, CVD, or spin-on techniques, most preferably by CVD. The thickness of third dielectric layer 570 may be between 0.05 and 10 microns. Next, a masking layer such as photoresist (not shown) is applied and patterned, and at least a portion of third dielectric layer 570 is removed by etching in specific locations, leaving a cavity. At least a portion of LED vertical interconnect 506 is exposed after this etch is complete. The etching may be accomplished by any suitable etchant, such as corrosive gases like $CHF_3$, $SF_6$, HBr, or wet chemical acid, such as hydrofluoric acid (HF), nitric acid ($HNO_3$), or sulfuric acid ($H_2SO_4$), most preferably by corrosive gas. The masking layer (not show) is then removed. Conductive material is then deposited in the cavity created in third dielectric layer 570. After deposition, the conductive material on surface 572 of fourth dielectric layer 570 may be removed by any suitable technique, including but not limited to CMP, wet chemical etch, plasma etch in corrosive gas, most preferably by CMP, leaving a bond pad 460 in the cavity of fourth dielectric layer 570. The conductive material for bond pad 460 may be deposited by any suitable technique, including but not limited to evaporation, CVD, sputtering, solution deposition, electrodeposition, or spray pyrolysis. Examples of conductive materials for bond pad 460 include but are not limited to titanium, titanium nitride, tungsten, tantalum, tantalum nitride, copper, and aluminum. In one embodiment, bond pad 460 comprises layers of titanium, tantalum nitride, and copper. Bond pad 460 forms a substantially ohmic contact to LED vertical interconnect 506. Fourth dielectric layer 570 and bond pad 460 are known as a bond pad layer. Bond pad layers are used throughout this application, and all follow the same basic fabrication sequence described above. LED apparatus 580 fabrication is now substantially complete.

Figure 12:
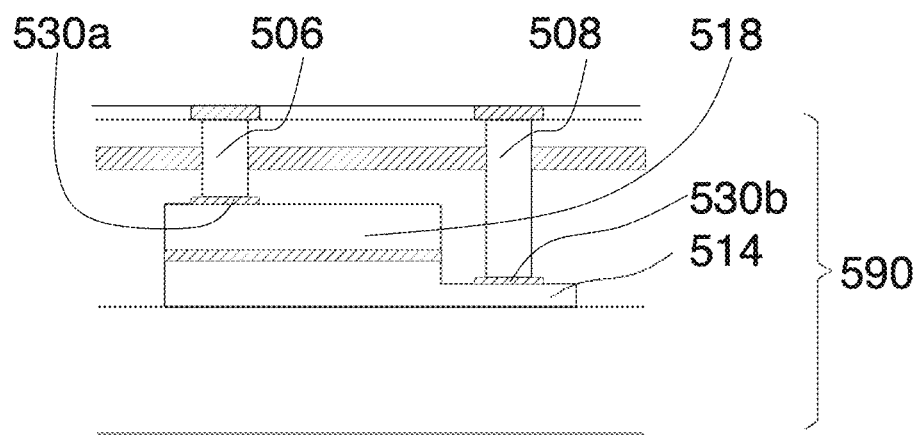
FIG. 12 schematically illustrates a cross-sectional view of an LED apparatus with an LED, a reflector layer, two LED vertical interconnects, and a bond pad layer.

A different embodiment of an LED apparatus is shown in FIG. 12. LED apparatus 590 has two LED vertical interconnects 506 and 508 contacting conductive layers 518 and 514, respectively, through LED contacts 530a and 530b.

IB. Transistors

Figure 13A:
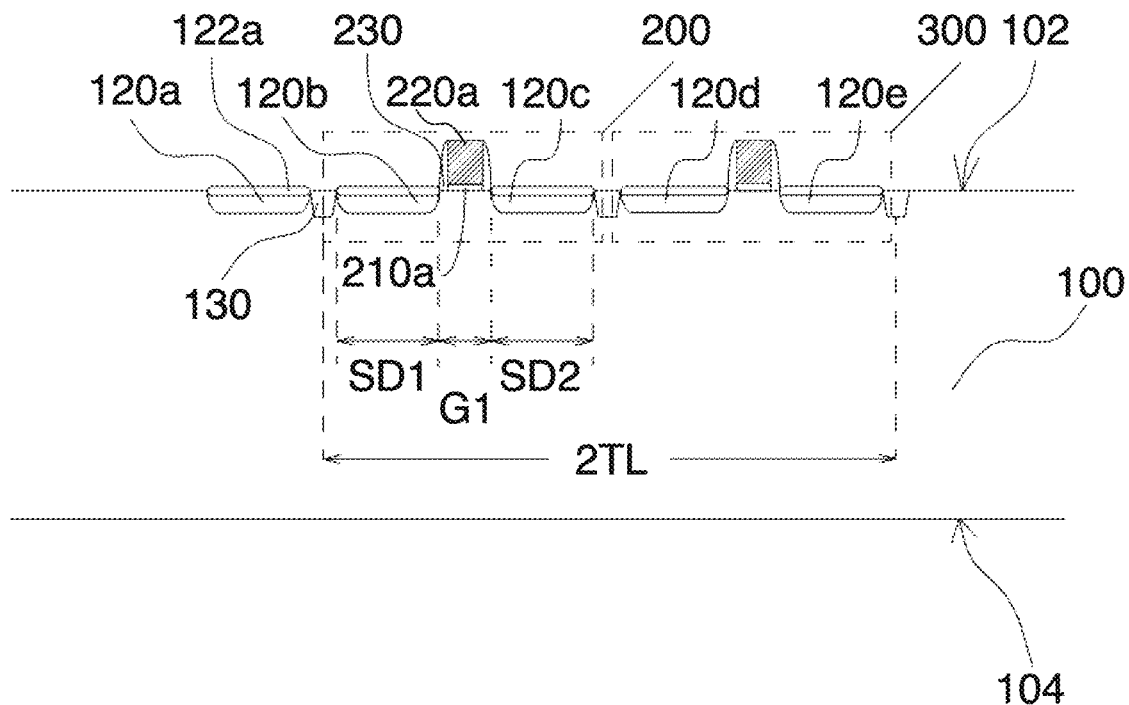
FIG. 13A schematically illustrates a cross-sectional view of transistors and a transistor substrate.

One part of a control apparatus, the transistors, and their fabrication method is now described. It is to be understood that fabrication of many more control apparatus than is shown can be occurring simultaneously on the transistor substrate. It is to be understood that any suitable single crystal transistors may be used, including but not limited to field effect transistors or bipolar transistors. By using single crystal semiconductor for the channel of the transistor, a higher carrier mobility is obtained compared to thin film transistors. Turning to FIG. 13A, transistors are fabricated in transistor substrate 100. Transistor substrate 100 may be any suitable single crystal semiconductor material, including but not limited to single crystal silicon, single crystal germanium, single crystal gallium arsenide, or single crystal gallium nitride, most preferably single crystal silicon. Transistor substrate 100 may comprise an etch-stop layer (not shown). The bottom surface 104 of the transistor substrate 100 is referred to as the initial bottom surface, because, in a later step, a portion of transistor substrate 100 including the initial bottom surface 104 will be removed, resulting in a different bottom surface. The etch-stop layer (not shown) may be any suitable material that has a substantially slower etch rate than transistor substrate 100. In one embodiment, the etch-stop layer may be silicon oxide, as provided by silicon-on-insulator (SOI) technology. In another embodiment, the etch-stop layer may be boron-doped silicon. A boron-doped silicon layer may be deposited as part of a thicker epitaxial layer deposition on a single crystal silicon wafer that comprises undoped silicon layers. The purpose of the etch-stop layer will be discussed in subsection IF.

Conductive regions 120a-e are formed in top surface 102 of transistor substrate 100. One method to form conductive regions 120a-e is by doping a portion of the transistor substrate 100 to be either p-type or n-type. It may be doped by any suitable technique, for example, by applying a masking layer (not shown), patterning, and then implanting ions. The masking layer is then removed. An anneal may activate the implanted ions. Conductive regions 120a-e are more conductive than the surrounding silicon substrate 100.

The conductive regions 120 may further comprise a silicide layer. The silicide layer may be formed on conductive regions 120a-e to further decrease the resistance, form ohmic contacts, and/or form an etch-stop layer for subsequent steps. A silicide layer is formed by deposition of a metal, including but not limited to titanium, cobalt, nickel, or tungsten, and then annealing at elevated temperature (above 400° C.) to react the metal with silicon to form a silicide film, for example, titanium silicide, cobalt silicide, nickel silicide, or tungsten silicide. An example of a silicide layer is shown as 122a. In other embodiments, a silicide layer is not a part of the conductive regions.

Conductive regions 120a-e may be isolated from one another electrically by dielectric regions 130 formed in top surface 102 of transistor substrate 100, in some embodiments. Dielectric regions 130 may be formed by shallow trench isolation (STI), field oxidation (FOX), or any other suitable dielectric region formation technique.

First transistor 200 comprises conductive region 120b, which may be a source or drain, conductive region 120c, which may be a source or a drain, a dielectric gate layer 210a, a conductive gate layer 220a, and a portion of transistor substrate 100 between conductive regions 120b and 120c which is the channel. The dimensions SD1 and SD2 of conductive regions 120b and 120c, respectively, may be from about 0.05 to 20 microns, for example about 0.5 microns. The dimension G1, which may be referred to as the gate length, may be from about 0.05 to 5 microns, for example about 1.0 micron. In one example, if dimensions SD1 and SD2 are 0.5 microns and dimension G1 is 1.0 microns, transistor 200 will have a total length of about 2.0 microns. Dielectric gate layer 210a may comprise silicon oxide, silicon nitride, aluminum oxide, hafnium silicon oxide, hafnium silicon oxide nitride, combinations therein, or any other suitable material. The thickness of dielectric gate layer 210a may be between 0.001 and 0.5 microns thick, for example about 0.02 microns. Conductive gate layer 220a may comprise any suitable material, including but not limited to conductive silicon, titanium nitride, tantalum, or tantalum nitride. Sidewall spacers 230 may exist on the sidewalls of conductive gate layers 220, one example of which is identified in FIG. 13A. Second transistor 300 comprises similar elements as first transistor 200, although the materials and dimensions of second transistor 300 may be the same as or different than those of first transistor 200. In one embodiment, transistor 300 also has a total length of about 2 microns. Including some of the length of the adjacent dielectric regions 130, the total length 2TL of transistors 200 and 300 may be about 5 microns in this example. Other elements of single crystal transistors, such as lightly doped drains (LDD), are not described or shown herein but are well known to those skilled in the art and may be incorporated in other embodiments.

Figure 13B:
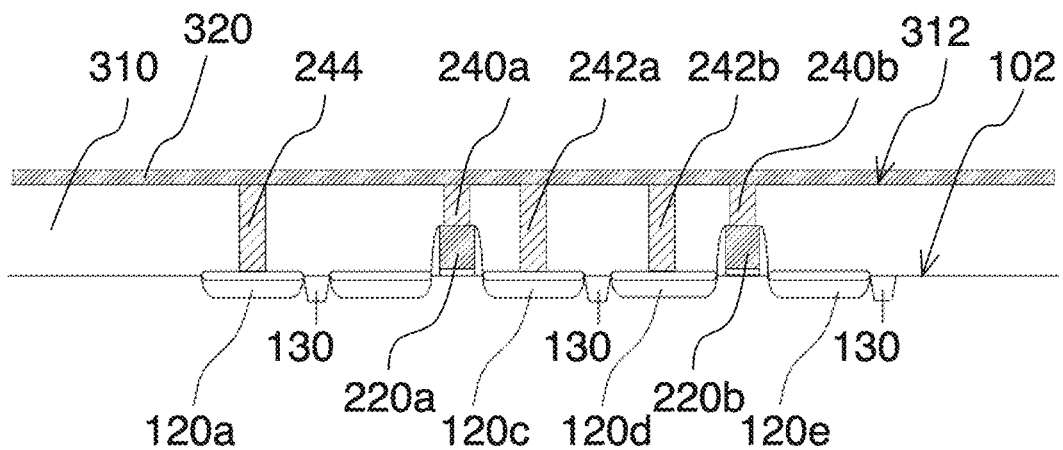
FIG. 13B schematically illustrates a cross-sectional view of transistors, a transistor substrate, and transistor vertical interconnects.

Turning to FIG. 13B, after transistor fabrication, fifth dielectric layer 310 is disposed on transistors 200 and 300, conductive regions 120a-e, dielectric layers 130, and transistor substrate 100. Fifth dielectric layer 310 may be any suitable material, including but not limited to silicon oxide, silicon nitride, or aluminum oxide, most preferably silicon oxide. Fifth dielectric layer 310 is deposited by any suitable technique, including evaporation, sputtering, spin on, or CVD, most preferably CVD. Fifth dielectric layer may be any suitable thickness, for example between 0.1 and 2 microns. In one embodiment the thickness is 0.2 microns. Top surface 312 of fifth dielectric layer 310 can be rendered substantially parallel to top surface 102 of transistor substrate 100. Subsequent steps in fabrication will be described assuming that surface 312 of fifth dielectric layer 310 shown in FIG. 13B has been planarized. It is to be understood that the fabrication could proceed without this planarizing step.

Transistor vertical interconnects are fabricated next. Transistor vertical interconnects form ohmic contacts to some or all of conductive regions 120 and conductive gate layers 220. Transistor vertical interconnects 240a, 240b, 242a, 242b, and 244 may be fabricated by any suitable technique. One example of transistor vertical interconnect fabrication is to deposit a masking layer (not shown), pattern the masking layer, and etch portions of fifth dielectric layer 310, exposing at least a portion of conductive regions 120a, 120c, and 120d and conductive gate layers 220a and 220b. The masking layer is then removed. Any suitable transistor vertical interconnect material, including but not limited to aluminum or tungsten, or a stack of titanium, titanium nitride, and aluminum, or a stack of titanium, titanium nitride, and tungsten, is deposited into the cavities where portions of fifth dielectric layer 310 were removed. The portions of transistor vertical interconnect material on surface 312 are removed by any suitable technique such as etchback or CMP, leaving transistor vertical interconnect material in the cavities of fifth dielectric layer 310. A via etch-stop layer 320 is then deposited on surface 312 of fifth dielectric layer 310. Via etch-stop layer 320 may be any suitable material, for example silicon nitride. Via etch-stop layer 320 may be deposited by any suitable technique, including evaporation, sputtering, spin on, or CVD, most preferably CVD, and may have any suitable thickness, for example 50 nm.

IC. Stack Capacitor

Figure 13C:
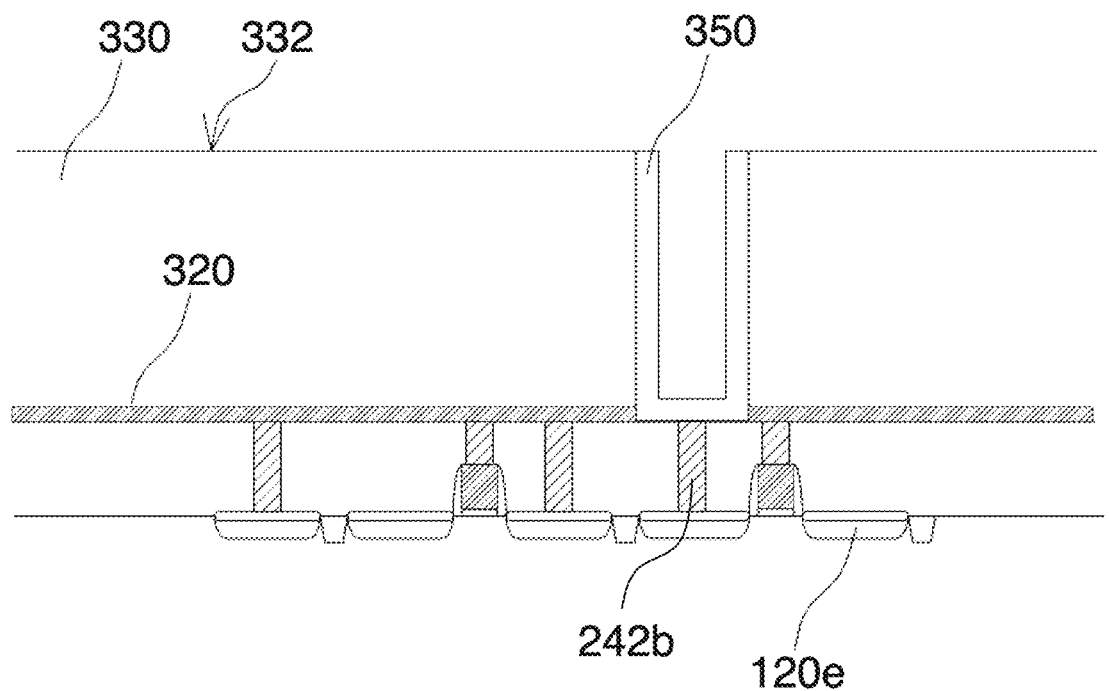
FIG. 13C schematically illustrates a cross-sectional view of transistors, a transistor substrate, transistor interconnects, and a lower stack capacitor electrode layer.

The stack capacitor (as shown in FIG. 5) and fabrication will now be described. In this application, a stack capacitor is above one of the transistors and has a longest dimension substantially orthogonal to the top surface of the transistor substrate. Turning to FIG. 13C, a sixth dielectric layer 330 is deposited on via etch-stop layer 320. Sixth dielectric layer 330 may be any suitable material, for example silicon oxide. Sixth dielectric layer 330 may be deposited by any suitable technique, including evaporation, sputtering, spin on, or CVD, most preferably CVD, and may be any suitable thickness, for example 2 microns. A masking layer (not shown) is then deposited and patterned, and portions of sixth dielectric layer 330 and via etch-stop layer 320 are removed by etching, leaving a cavity in sixth dielectric layer 330 and via etch-stop layer 320, and exposing at least a portion of transistor vertical interconnect 242b. The masking layer is then removed. A lower stack capacitor electrode layer 350 is then deposited in the cavities of sixth dielectric layer 330 and etch-stop layer 320. Lower stack capacitor electrode layer 350 and transistor vertical interconnect 242b are connected electrically. Any suitable material may be used for lower stack capacitor electrode layer 350, including but not limited to doped polysilicon, titanium nitride, platinum, tantalum, molybdenum, or cobalt, or combinations therein. Lower stack capacitor electrode layer 350 may be deposited by any suitable technique, including but not limited to evaporation, sputtering, or CVD, and may have any suitable thickness from about 5 nm to 500 nm, for example about 20 nm. A masking layer (not shown) is then deposited and patterned, and the portions of lower capacitor electrode layer 350 on surface 332 are etched, leaving the structure as shown in FIG. 13C. The masking layer is removed.

Figure 13D:
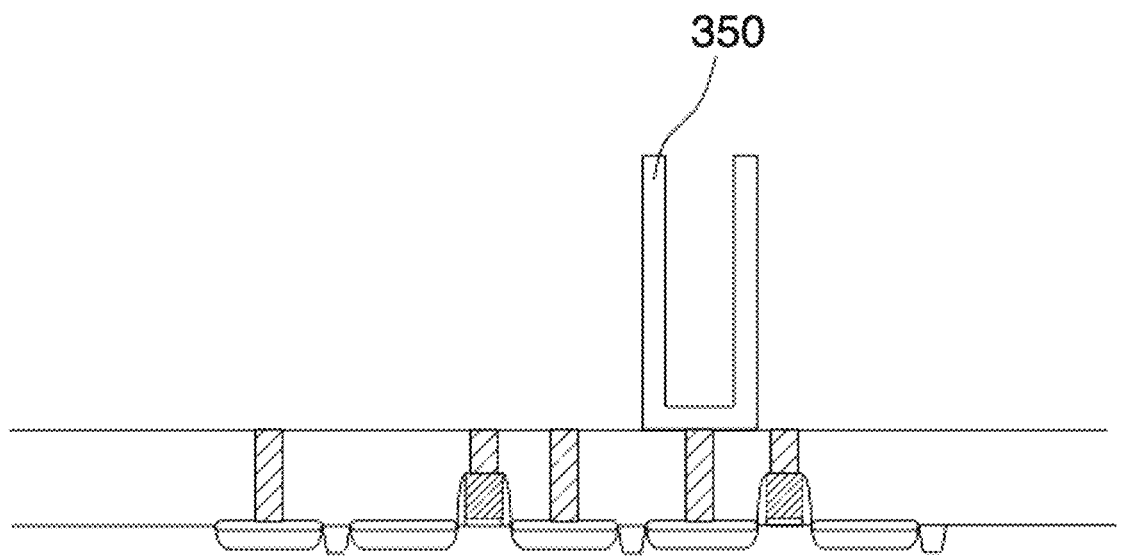
FIG. 13D schematically illustrates a cross-sectional view of transistors, a transistor substrate, transistor interconnects, and a lower stack capacitor electrode layer.

Turning to FIG. 13D, sixth dielectric layer 330 and via etch-stop layer 320 are removed by selective etching. In one embodiment (referring to both FIGS. 13C and 13D), sixth dielectric layer 330 may comprise silicon oxide and via etch-stop layer 320 may comprise silicon nitride, and lower stack capacitor electrode layer 350 may comprise doped polysilicon. Dilute hydrofluoric acid will etch silicon oxide rapidly while etching silicon nitride and doped polysilicon slowly. After sixth dielectric layer 330 is removed by dilute hydrofluoric acid etch, via etch-stop layer 320 can then be removed selectively by etching in hot phosphoric acid. Hot phosphoric acid will etch silicon nitride rapidly while etching silicon oxide and doped polysilicon slowly.

Figure 13E:
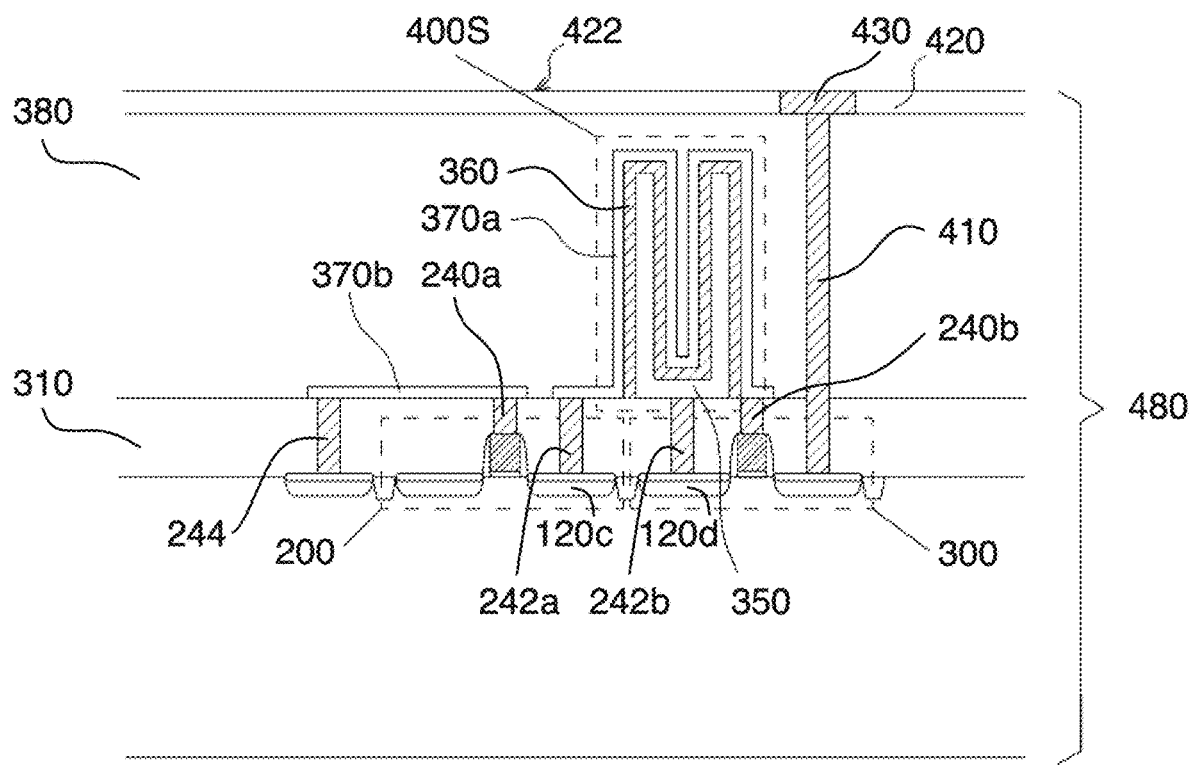
FIG. 13E schematically illustrates a cross-sectional view of a control apparatus.

Turning to FIG. 13E, a capacitor dielectric layer 360 is then deposited on lower stack capacitor electrode layer 350. Capacitor dielectric layer 360 may be deposited by any suitable technique, including evaporation, sputtering, and CVD, and may have any suitable thickness from about 5 nm to 100 nm, for example about 10 nm. Capacitor dielectric layer 360 may comprise any suitable material or combination of materials, including but not limited to silicon oxide, silicon nitride, hafnium oxide, zirconium oxide, or aluminum oxide. A masking layer (not shown) is then deposited and patterned, and portions of capacitor dielectric layer 360 are removed by etching. An upper stack capacitor electrode layer 370 (patterned in a later step into sections 370a and 370b, as shown) is then deposited on capacitor dielectric layer 360. Upper stack capacitor electrode layer 370 may be deposited by similar techniques, have similar thickness, and comprise similar or different materials as lower stack capacitor electrode layer 350. A masking layer (not shown), is then deposited and patterned, and portions of upper stack capacitor electrode layer 370 are removed by etching, creating portions 370a and 370b. The masking layer is then removed. Capacitor 400S fabrication is now substantially complete. A seventh dielectric layer 380 is deposited over capacitor 400S and planarized. The vertical orientation of stack capacitor 400S has a small footprint. Upper stack capacitor electrode layer portion 370a is electrically connected to transistor vertical interconnects 242a and 240b as well as capacitor dielectric layer 360, as shown in FIG. 13D. Transistor vertical interconnect 242a is electrically connected to conductive region 120c, which is the source or drain of transistor 200. Lower stack capacitor electrode layer 350 is electrically connected to transistor vertical interconnect 242b. Transistor vertical interconnect 242b is electrically connected to conductive region 120d, which is the source or drain of transistor 300. Through the connections described above, capacitor 400S is in operative communication with first transistor 200 and second transistor 300. Upper stack capacitor electrode layer portion 370b electrically connects transistor vertical interconnects 244 and 240a. Upper stack capacitor electrode layer portion 370b may also be referred to as a horizontal interconnect.

Transistor vertical interconnect 410 is formed in seventh dielectric layer 380 and sixth dielectric layer 310 by techniques similar to those described earlier for transistor vertical interconnects 244 and 242a and 242b. A bond pad layer comprising eighth dielectric layer 420 and a bond pad 430 is then formed on seventh dielectric layer 380. Control apparatus 480 fabrication is now substantially complete.

ID. Trench Capacitor

Figure 14A:
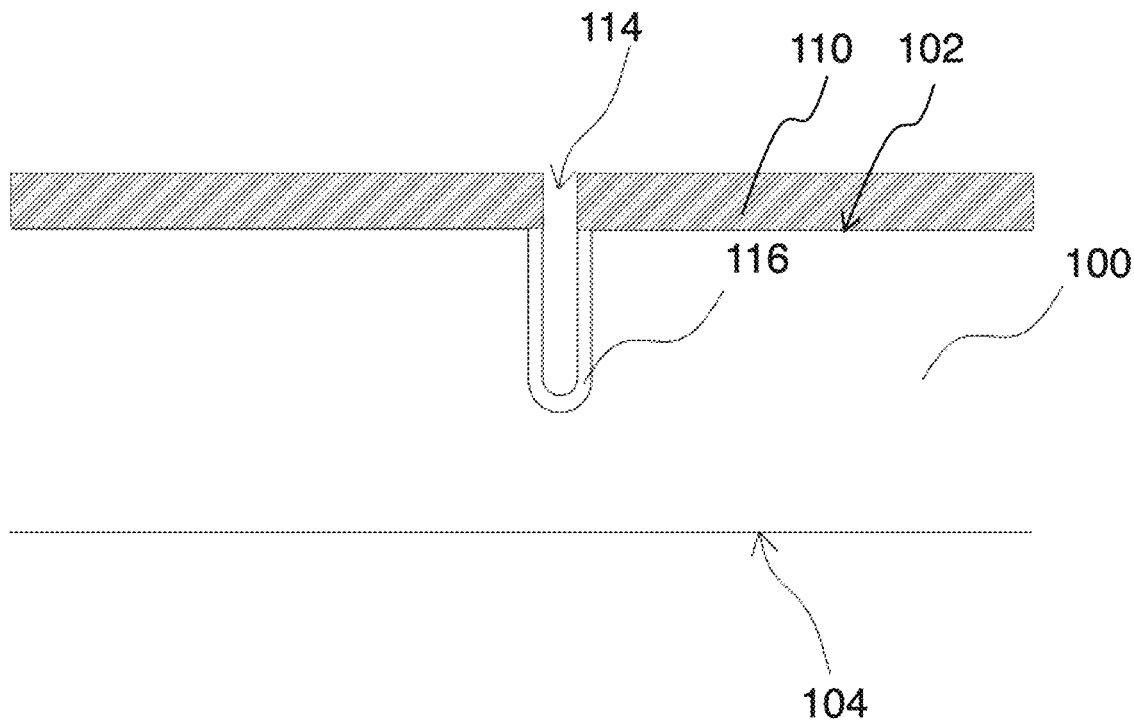
FIG. 14A schematically illustrates a cross-sectional view of the lower trench capacitor electrode in a transistor substrate.
Figure 14B:
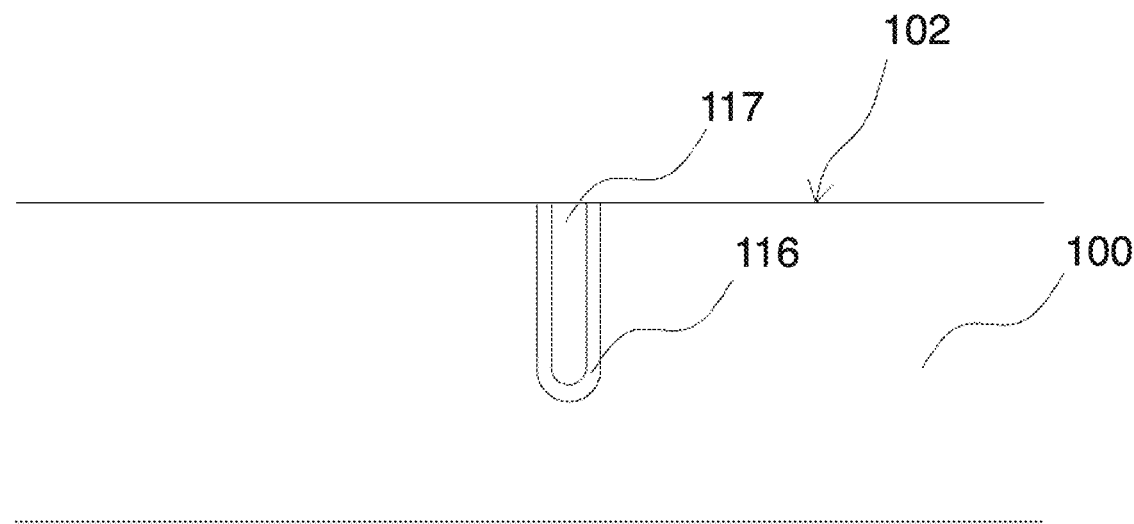
FIG. 14B schematically illustrates a cross-sectional view of the lower trench capacitor electrode with a mold nitride layer.

A different embodiment of the fabrication of the control apparatus employing a trench capacitor is now described. In this application a trench capacitor is at least partially formed in the transistor substrate and has a longest dimension orthogonal to the top surface of the transistor substrate. The description of transistor fabrication is condensed, as much of the previous more detailed description of transistor fabrication is applicable to this embodiment. Turning to FIG. 14A, a pad oxide layer 110 is first deposited or grown on transistor substrate 100. Pad oxide layer 110 may be any suitable thickness, for example about 10 nm, and may comprise silicon oxide. A masking layer (not shown), is applied and patterned, and a cavity 114 is etched in pad oxide layer 110 and a portion of transistor substrate 100. The masking layer is then removed. A conductive region is then formed in transistor substrate 100 where the etch has exposed transistor substrate 100. This conductive region is lower trench capacitor electrode 116. Lower trench capacitor electrode 116 is formed by doping the exposed portion of transistor substrate 100. The doping may be n-type or p-type and may be accomplished by any suitable method. One method is by exposing transistor substrate 100 to a dopant containing gas such as phosphine or boron trichloride at an elevated temperature, for example greater than 700° C. Phosphorus or boron atoms will diffuse into transistor substrate 100. Another method is to deposit a dopant-containing material, such as phosphorous silicate glass (PSG), into cavity 114 in transistor substrate 100 and anneal at an elevated temperature, for example greater than 700° C., and then remove the PSG material by selective etching. This will cause phosphorus atoms to diffuse from the PSG material into transistor substrate 100. With either doping method, pad oxide layer 110 prevents the non-exposed portions of transistor substrate 100 from being doped. Referring to both FIGS. 14A and 14B, after lower trench capacitor electrode 116 is formed. Pad oxide layer 110 is then removed by selective etching, by, for example dilute hydrofluoric acid. A mold nitride layer 117 is then deposited in the remainder of cavity 114. Mold nitride layer 117 may comprise silicon nitride deposited by CVD. The portions of mold nitride layer 117 on surface 102 may be removed by an etch, which does not remove the portion of mold nitride layer 117 in the cavity.

Figure 14C:
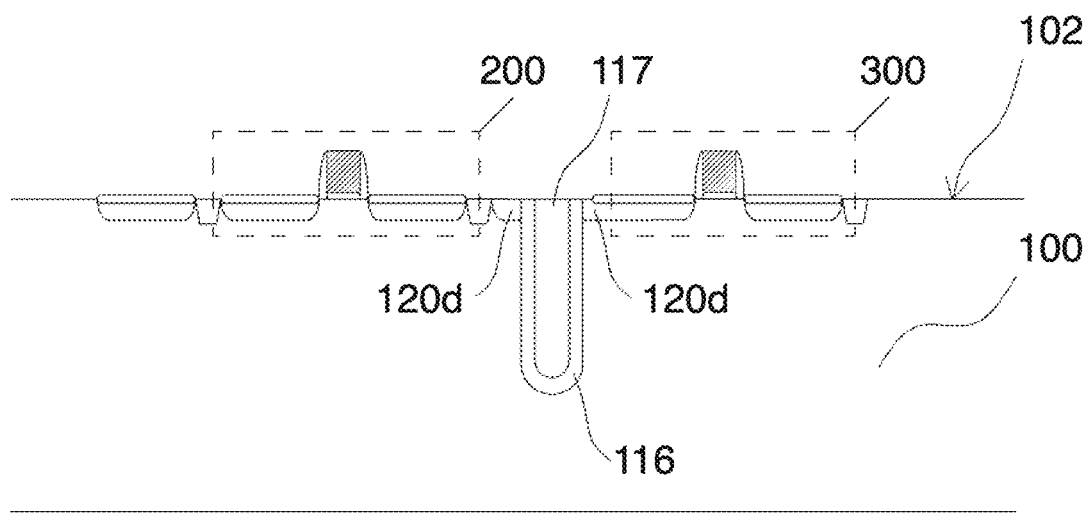
FIG. 14C schematically illustrates a cross-sectional view of the lower trench capacitor electrode with a mold nitride layer and transistors formed in the upper surface of the transistor substrate.
Figure 14D:
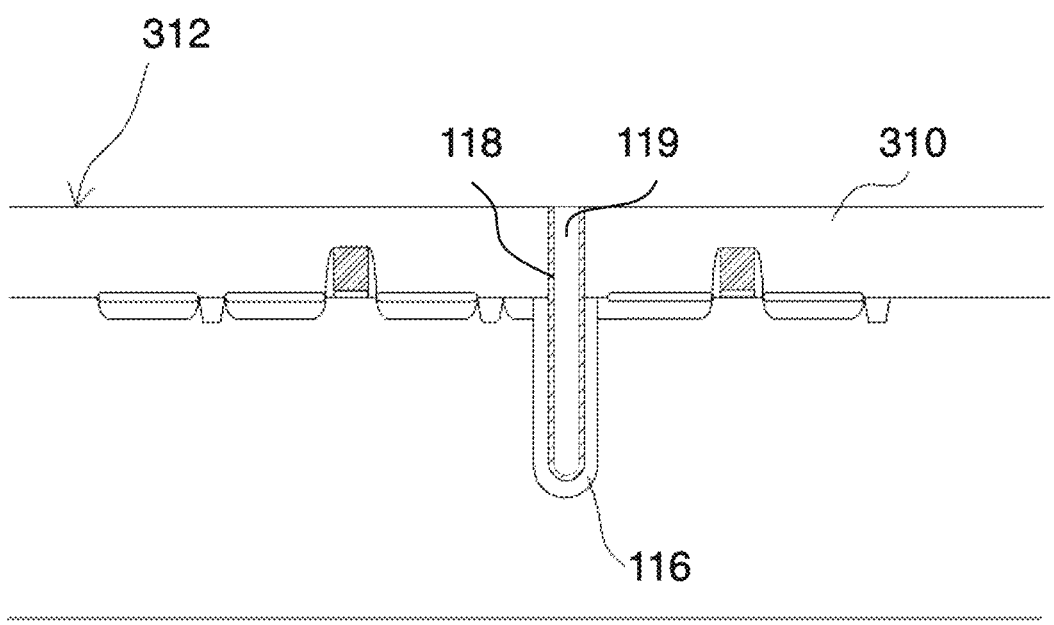
FIG. 14D schematically illustrates a cross-sectional view of a trench capacitor and transistors.

Turning to FIG. 14C, transistors 200 and 300 are formed in top surface 102 of transistor substrate 100 using the fabrication techniques described earlier. Conductive region 120d of transistor 300 and lower trench capacitor electrode 116 are electrically connected after transistor fabrication. Referring to FIGS. 14C and 14D, fifth dielectric layer 310 is deposited and planarized. A masking layer (not shown) is deposited and patterned on fifth dielectric layer 310, and a cavity is etched in fifth dielectric layer 310. The masking layer is removed. Mold nitride layer 117 is removed by selective etching. A trench capacitor dielectric layer 118 and upper trench capacitor electrode layer 119 are deposited sequentially into the cavity onto exposed lower trench capacitor electrode layer 116. Portions of trench capacitor dielectric layer 118 and upper trench capacitor electrode layer 119 can be removed from surface 312 of fifth dielectric layer 310 by CMP or etching, leaving the structure shown in FIG. 14D.

Figure 14E:
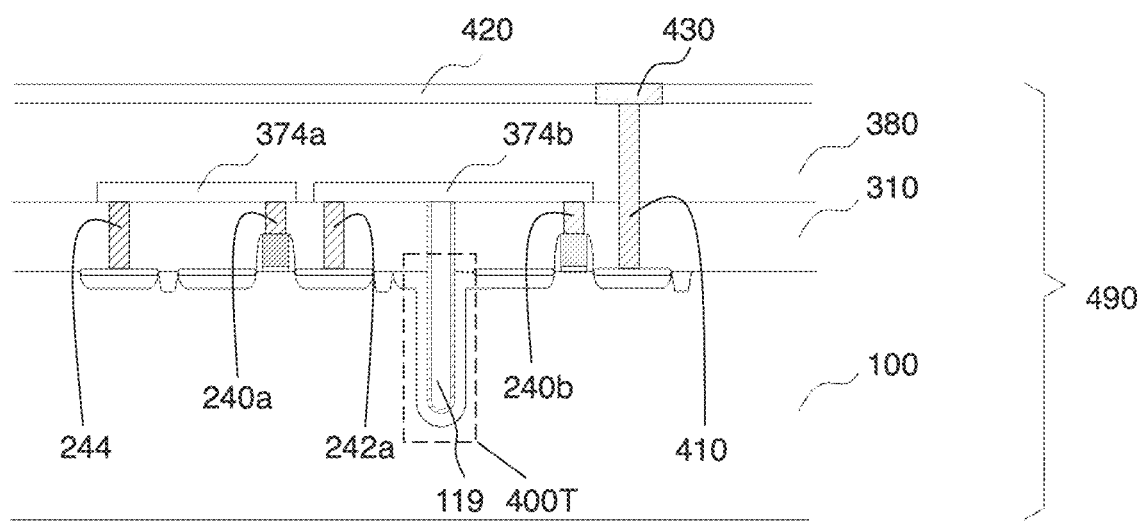
FIG. 14E schematically illustrates a cross-sectional view of a control apparatus.

Turning to FIG. 14E, transistor vertical interconnects 244, 240a, 242a, 240b, and 410, seventh dielectric layer 380, bond pad 430 and eighth dielectric layer 420 are formed by similar techniques as described earlier. In addition, horizontal interconnects 374a and 374b are formed in seventh dielectric layer 380. Horizontal interconnect 374a connects transistor vertical interconnect 244 to transistor vertical interconnect 240a. Horizontal interconnect 374b connects transistor vertical interconnects 242a and 240b, and upper trench capacitor electrode 119. Control apparatus 490 fabrication with trench capacitor 400T is now substantially complete. The vertical orientation of trench capacitor 400T gives it a small footprint.

IE. Bonding the Control Apparatus to the LED Apparatus

Figure 15A:
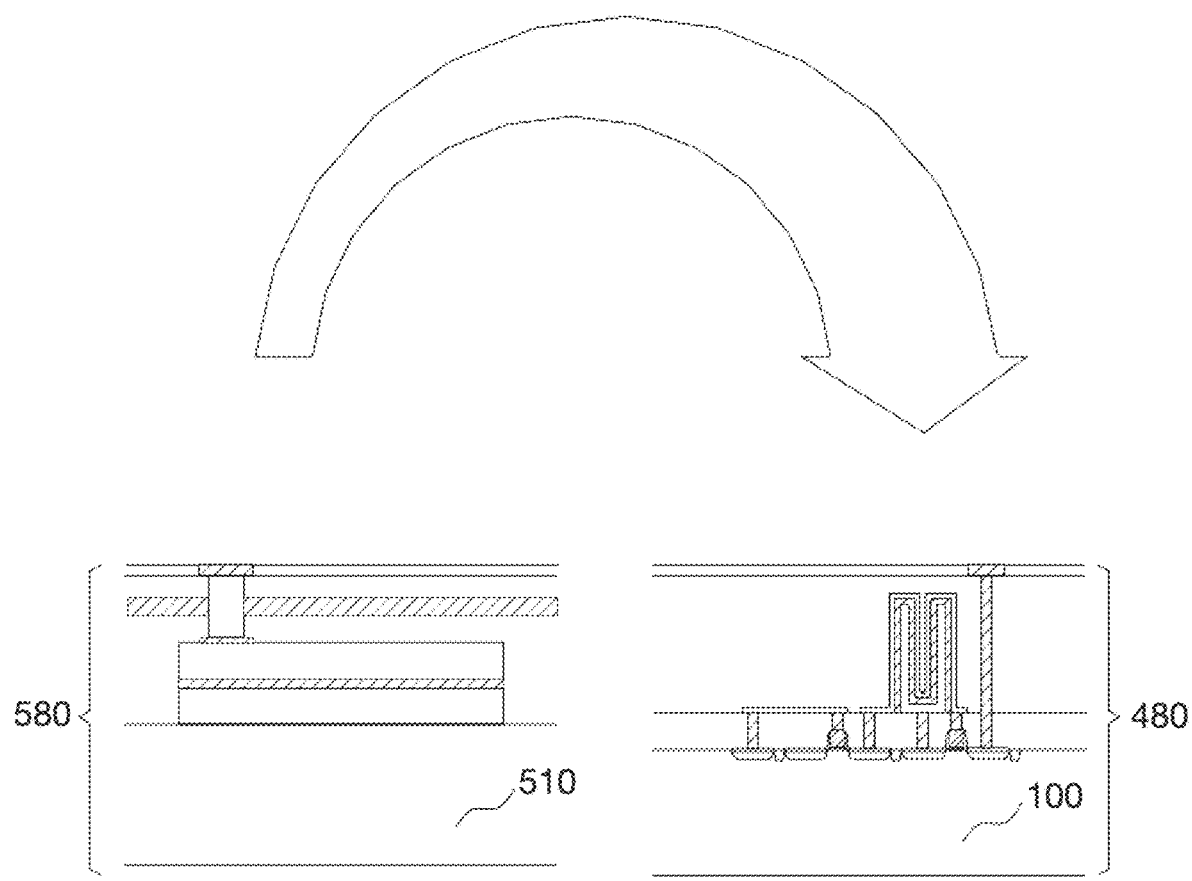
FIG. 15A schematically illustrates a cross-sectional view of the action of flipping an LED apparatus and bonding to a control apparatus.
Figure 15B:
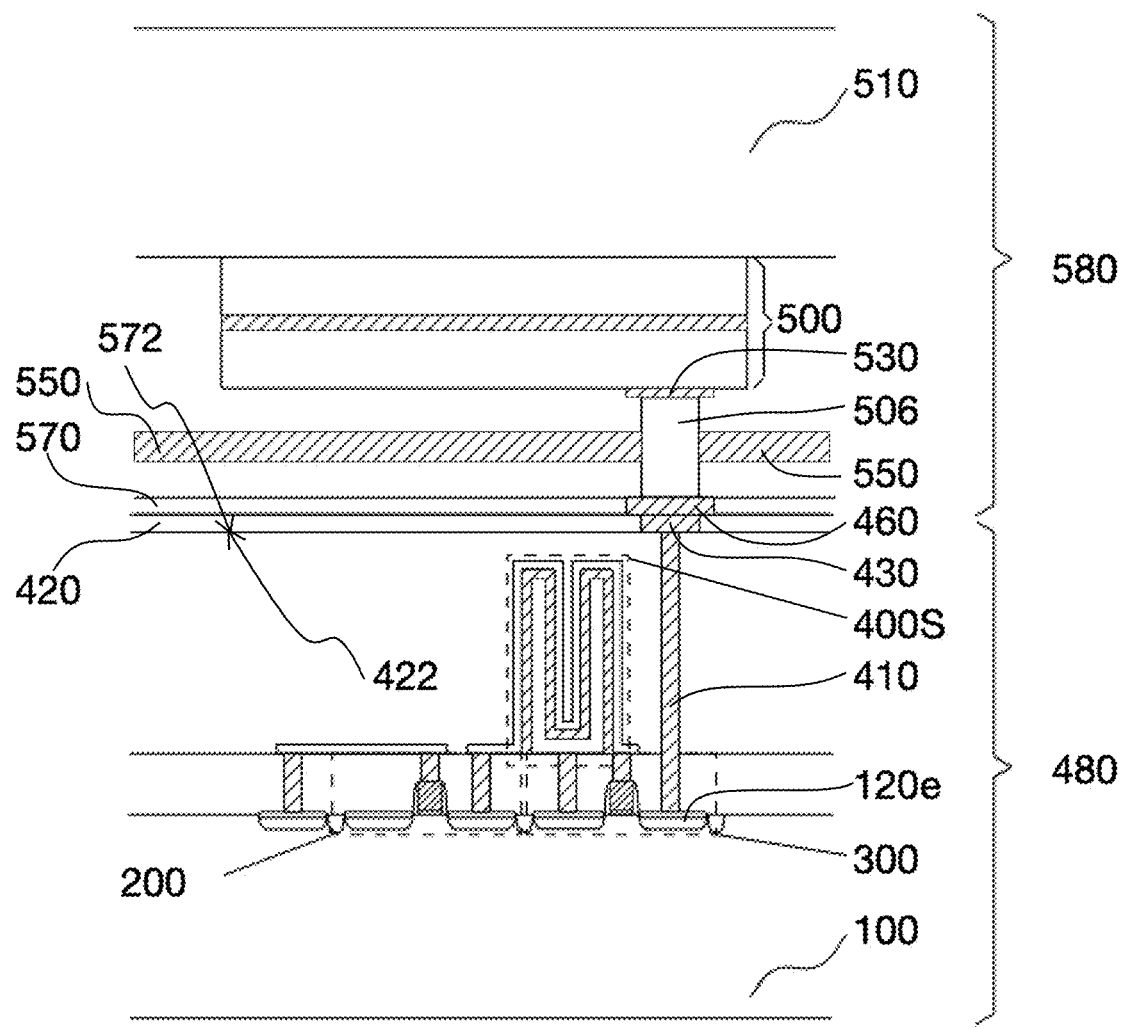
FIG. 15B schematically illustrates a cross-sectional view of the bonded pair of LED apparatus+control apparatus.

Turning to FIG. 15A, in one embodiment LED apparatus 580 (with a single LED vertical interconnect, shown in FIG. 11C) is flipped over and bonded to control apparatus 480 (with a stack capacitor, shown in FIG. 13E), with the two bonded apparatus shown in FIG. 15B. In other embodiments LED apparatus 590 (with two LED vertical interconnects, shown in FIG. 12) and/or control apparatus 490 (with a trench capacitor, shown in FIG. 14E) may be used in the bonding. The technique is sometimes referred to as flip-chip bonding as the devices on each respective substrate face one another, and transistor substrate 100 and LED substrate 510 are the outermost surfaces of the bonded pair. Any suitable bonding technique may be used, including but not limited to hybrid bonding, thermocompression bonding, anodic bonding, plasma activated bonding, eutectic bonding, or surface activated bonding, most preferably hybrid bonding. The bond formed between two structures may be: wafer-to-wafer, in which two wafers each with multiple die are bonded to one another; die-to-wafer, in which a die or dies are bonded to a wafer; or die-to-die, in which a die is bonded to another die. A wafer usually comprises multiple die. Hybrid wafer bonding or hybrid die bonding describes the joining of two surfaces, wherein at least one of the two surfaces comprises at least two different materials. In one example of hybrid bonding, the two surfaces are brought into contact under pressure and heated to achieve a bond of the two surfaces.

As shown in FIG. 15B, surface 572 of LED apparatus 580 is in contact with surface 422 of control apparatus 480 after bonding. The largest area of LED 500 now overlies first transistor 200, second transistor 300, and capacitor 400S. LED 500 is in operative communication with transistor 300 through the connections of transistor vertical interconnect 410, bond pads 430 and 460, and LED vertical interconnect 506, and LED contact 530. Reflector layer 550 is disposed between LED 500 and transistor substrate 100. It is important to note that LED apparatus 580 is not connected to control apparatus 480 through wire bonds, which are common in the prior art. Wire bonds are interconnects that join two devices by a wire that was mechanically placed and bonded to the two devices using downward pressure and ultrasonic energy and/or heat. The wires in wire bonds are typically 15 microns in diameter or larger and have metal balls at either end that are larger than 15 microns in diameter.

IF. Through Substrate Interconnects

Until this point in the fabrication sequence of this embodiment, both LED substrate 510 and transistor substrate 100 have remained fully intact, as shown in FIG. 15B. Both LED substrate 510 and transistor substrate 100 may be about 500 microns thick, although they may be any suitable thickness that allows for mechanical handling during fabrication. This thickness imparts mechanical stability to the respective substrates and allows the plurality of devices to be handled during fabrication. With two thick substrates bonded together, one of the two substrates can now be removed in whole or in part, and the structure will retain mechanical stability for handling with one substrate intact.

Figure 16A:
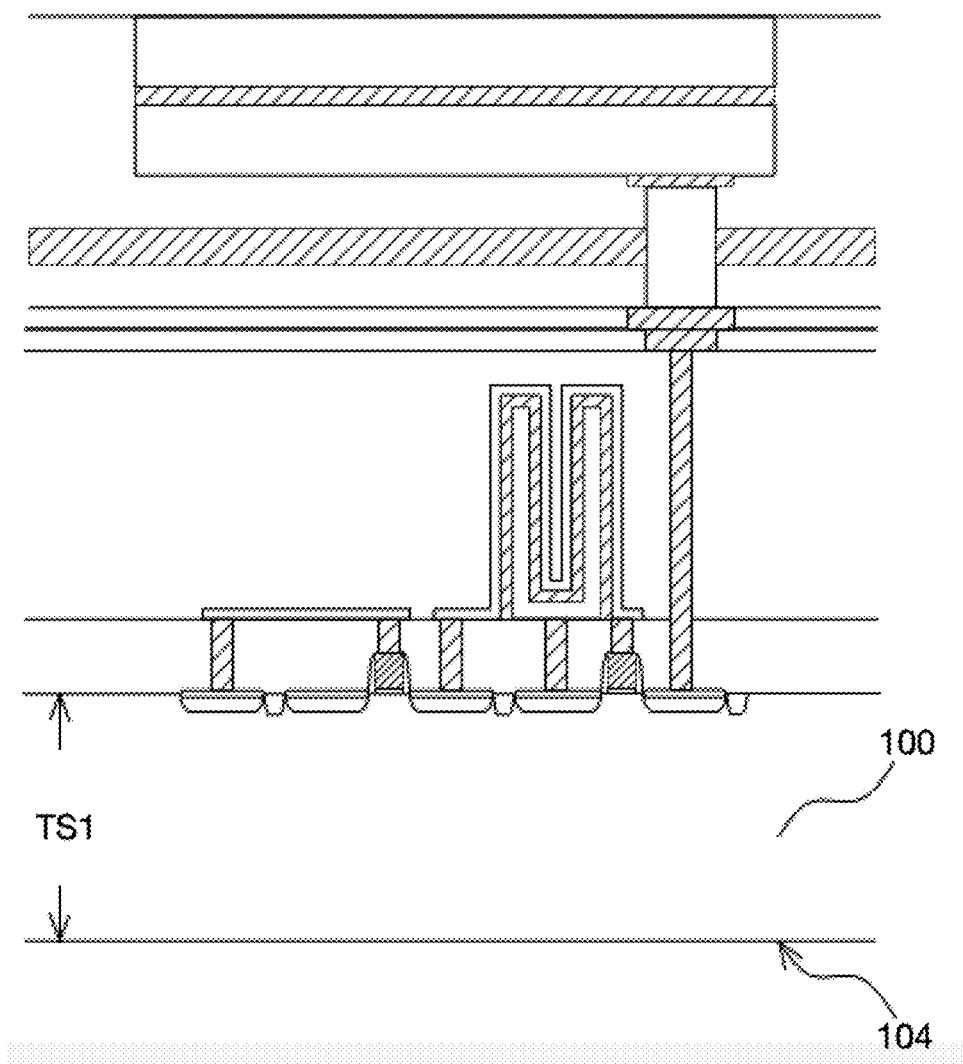
FIG. 16A schematically illustrates a cross-sectional view of the bonded pair of LED apparatus+control apparatus with both substrates intact.
Figure 16B:
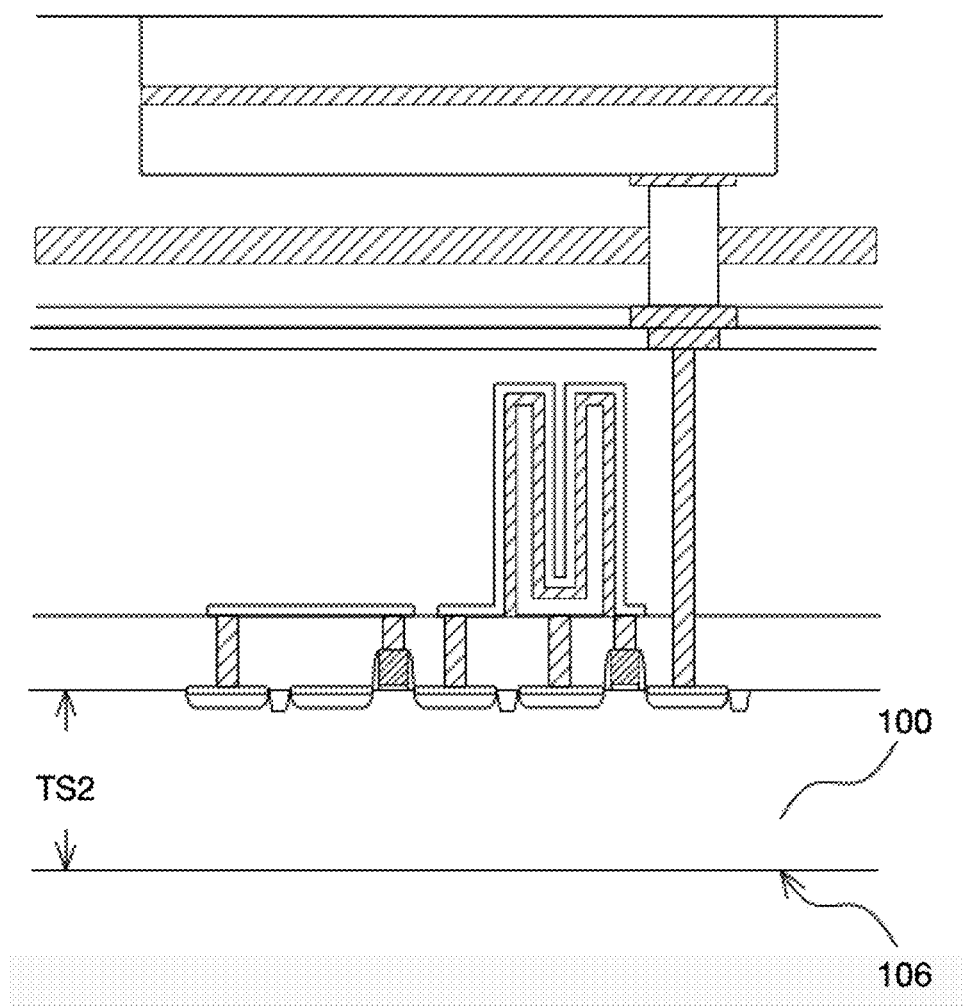
FIG. 16B schematically illustrates a cross-sectional view of the bonded pair of LED apparatus+control apparatus after a portion of the transistor substrate has been removed.

Turning to FIGS. 16A and 16B, a portion of transistor substrate 100 is now removed. Transistor substrate 100 in FIG. 16A has an original thickness TS1. A portion of transistor substrate 100 can be removed by any suitable wafer thinning technique, including but not limited to laser lift off, mechanical polishing, or chemical etch. In one embodiment, mechanical polishing may be combined with chemical etch to remove a thickness of the transistor substrate 100, with resultant transistor substrate thickness TS2 shown in FIG. 16B. Thickness TS2 is substantially less than thickness TS1. Due to the scale of FIGS. 16A and B, the thickness of transistor substrate 100 removed is not accurately shown. By combining mechanical polishing with chemical etching, a more precise thickness of transistor substrate 100 may be removed at lower cost and with greater precision in the remaining substrate thickness than if either technique was used alone. For example, mechanical polishing may first remove about 400 microns of an initial 500 micron-thick dimension TS1 of transistor substrate 100, resulting in a post-polish transistor substrate thickness of about 100 microns. For wafer thinning by polishing, the wafer is rotated about its center on a surface with abrasive media. Wafer thinning by mechanical force is sometimes referred to as grinding when the remaining substrate surface is rough, and polishing when the remaining substrate surface is smooth. Either grinding or polishing, or a combination, may be used. After grinding and/or polishing, a chemical etch may then remove about 95 microns of the remaining 100 microns, leaving 5 microns (dimension TS2) of transistor substrate 100. Chemical etch of transistor substrate 100 may be accomplished by any suitable chemistry. For example, KOH, TMAH, HF+HNO$_3$, or HF+NH$_4$F chemistries may be used to etch silicon substrates. An etch-stop layer in transistor substrate 100 (not shown) may act to slow or stop the rate of substrate grinding, polishing, or etching so that the remaining thickness TS2 of transistor substrate 100 may be reliably determined. For example, if KOH is used to etch silicon, KOH will etch undoped silicon about 20× faster than a heavily boron-doped silicon etch-stop layer. The boron-doped layer of silicon acts as an efficient etch-stop for silicon etching. If silicon oxide is used as the etch-stop layer, KOH will etch silicon about 500× faster than it will etch silicon oxide. The silicon oxide layer acts as an efficient etch-stop for silicon etching. Initial bottom surface 104 of transistor substrate 100 is removed. Referring to FIG. 16B, after removal of a portion of transistor substrate 100, the remaining portion of transistor substrate 100 designated by dimension TS2 remains and has a bottom surface 106. The final thickness TS2 of transistor substrate 100 may be any suitable dimension from 0.1 to 100 microns, most preferably less than 20 microns. Reducing the value of TS2 to less than 20 microns facilitates formation of through substrate interconnects with small size.

Figure 16C:
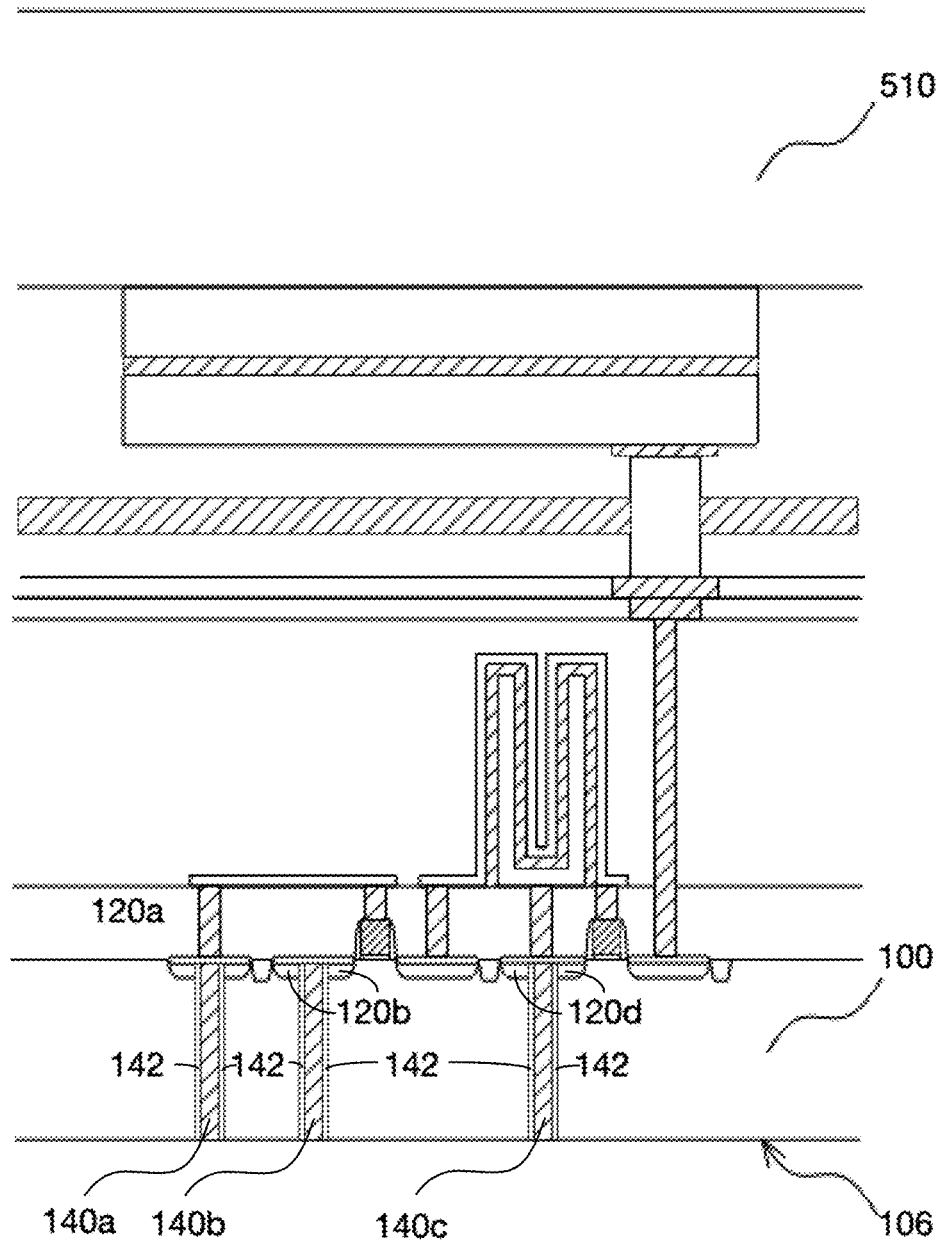
FIG. 16C schematically illustrates a cross-sectional view of the bonded pair of LED apparatus+control apparatus after formation of through substrate interconnects.

By removing most of the original transistor substrate 100, through substrate interconnects with small features can now be fabricated in the remaining transistor substrate 100. Turning to FIG. 16C, through substrate interconnects are fabricated by first masking and etching cavities in transistor substrate 100. The cavities in substrate 100 expose a portion of conductive regions 120a, 120b, and 120d. Portions of transistor substrate 100 may be etched by any suitable etchant, including corrosive gases or chemical acids, most preferably by corrosive gases. The masking layer (not shown) is then removed. In one embodiment, after etching, a sidewall dielectric layer 142 may be formed on the sidewalls of the cavities in transistor substrate 100. Sidewall dielectric layer 142 will insulate the sidewalls of the transistor substrate 100 from the subsequently formed through substrate interconnects. Sidewall dielectric layer 142 may comprise any suitable material, including but not limited to silicon oxide or silicon nitride, most preferably silicon oxide. Sidewall dielectric layer 142 may be deposited by any technique with good step coverage, most preferably by CVD. Portions of sidewall dielectric layer 142 that is deposited on conductive regions 120 can be removed by an anisotropic etch. This anisotropic etch will remove dielectric layer 142 from the surface of conductive region 120 while leaving it on the sidewalls of transistor substrate 100. This process allows the through substrate interconnect that follows to make electrical contact to the conductive regions 120 while being insulated from transistor substrate 100. The remaining portions of sidewall dielectric layer 142 are shown in FIG. 16C. In other embodiments, a sidewall dielectric layer is not needed on the sidewalls of the cavities in transistor substrate 100, for example when transistor substrate 100 is not substantially conductive.

Figure 16D:
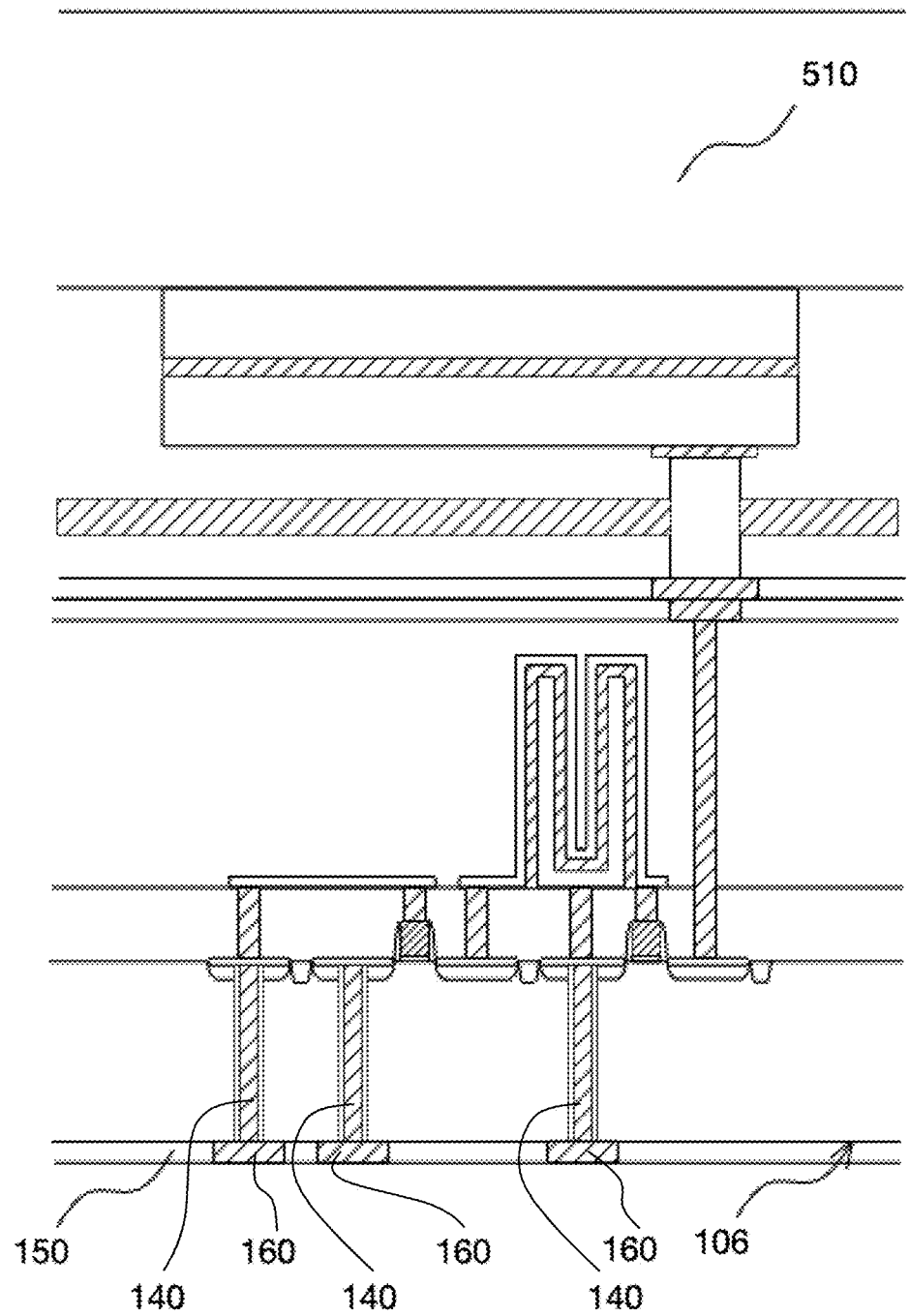
FIG. 16D schematically illustrates a cross-sectional view of the bonded pair of LED apparatus+control apparatus after formation of a bond pad layer on the bottom surface of the transistor substrate.

Turning to FIG. 16D, through substrate interconnect material is deposited in the cavities of transistor substrate 100. The through substrate interconnect material may comprise any suitable material, including but not limited to aluminum, copper, or tungsten, or a stack of titanium, titanium nitride, and aluminum layers, or a stack of titanium, titanium nitride, and tungsten layers, or a stack of titanium, tantalum nitride, and copper layers. Any suitable method for through substrate interconnect deposition may be used, such as evaporation, sputtering, electrodeposition, or CVD. Through substrate interconnect material on surface 106 can be removed by etching or CMP, most preferably by CMP, leaving through substrate interconnects 140 as shown in FIG. 16D.

A bond pad layer is formed on surface 106, resulting in bond pads 160 in ninth dielectric layer 150. Bond pads 160 are connected to through substrate interconnects 140. LED substrate 510 remains on the apparatus at this point in fabrication to allow for mechanical handling of the bonded apparatus.

IG. Bonding the Paired LED+Control Apparatus to a Backboard

Figure 17:
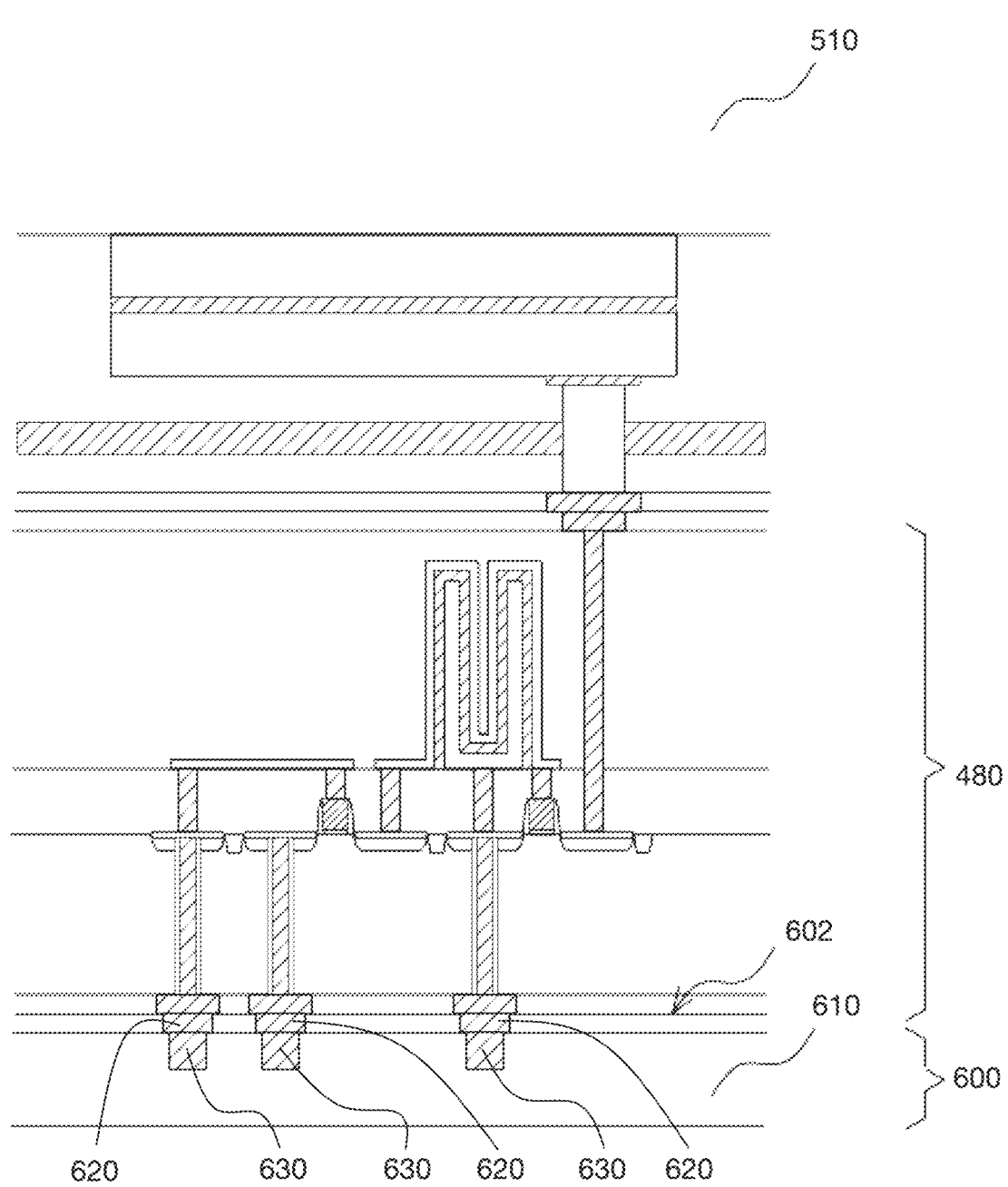
FIG. 17 schematically illustrates a cross-sectional view of the bonded pair of LED apparatus+control apparatus after bonding to a backboard.

Turning to FIG. 17, the LED+control apparatus pair is bonded to the backboard 600. Backboard 600 comprises a backboard substrate 610 with a plurality of bond pads 620 and a plurality of backboard interconnects 630. Backboard 600 may comprise a printed circuit board (PCB) or an interposer. An interposer may comprise a silicon oxide or silicon substrate, and will have a smooth surface 602 compared to a PCB. The surface roughness of surface 602 will be less than 0.2 microns root mean square for an interposer. The surface roughness of a PCB made of FR-4 may exceed 5 microns root mean square. The small surface roughness of an interposer allows the patterning by lithography of fine features less than 0.5 micron in size, such as the plurality of backboard interconnects 630. In one embodiment, backboard 600 may comprise an interposer, and backboard interconnects 630 may be fabricated by a damascene process in silicon oxide. Backboard interconnects 630 may comprise copper or any suitable conductive material. Backboard interconnects 630 are shown as a single layer in FIG. 17. In other embodiments, backboard interconnects 630 may be fabricated as multiple layers. In a different embodiment, backboard 600 may comprise a printed circuit board (PCB) with the backboard substrate 610 comprising FR-4 material and backboard interconnects 630 comprising copper. An interposer can generally provide smaller feature sizes and pitches of backboard interconnects compared with a PCB, and an interposer is preferred for this reason. The interposer may comprise additional aspects (not shown), such as adhesive metal layers, micro bump connections, ball or stud bumps, or copper paste, or any suitable feature.

After bonding, backboard interconnects 630 are connected electrically to control apparatus 480. Any suitable bonding technique may be used to join the backboard 600 to the control apparatus 480, including but not limited to thermocompression bonding, adhesive bonding, anodic bonding, plasma activated bonding, eutectic bonding, or surface activated bonding, most preferably thermocompression bonding. Other techniques may be used to physically and connect backboard 600 to control apparatus 480, including but not limited to ball or stud bumping and copper pasting. The principles and mechanisms of bonding are well known to those skilled in the art.

IH. Formation of Wavelength-Converting Layer

Figure 18A:
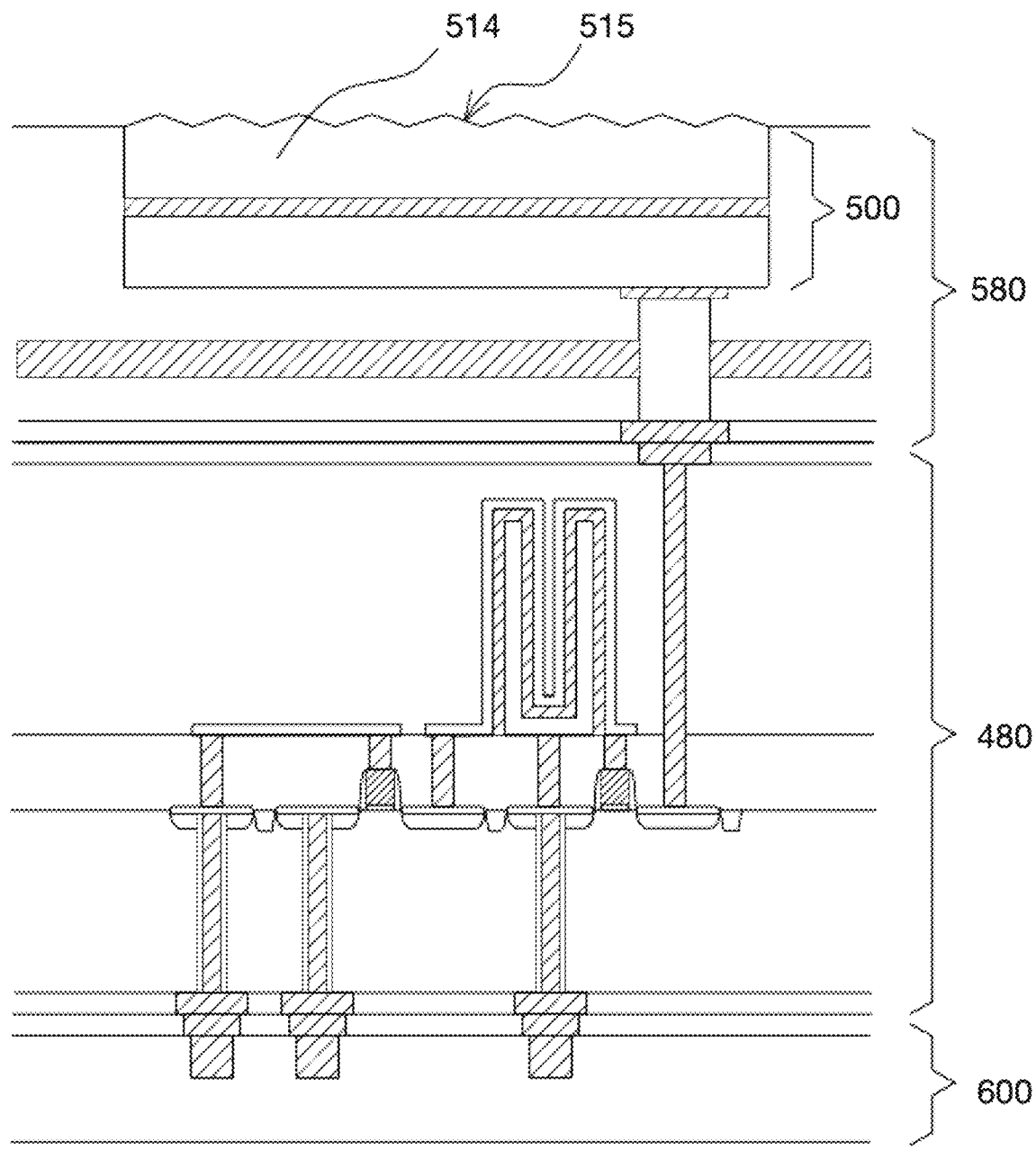
FIG. 18A schematically illustrates a cross-sectional view of the partially fabricated light emitting device after roughening the surface of the lower conductive layer of the LED.

Turning to FIG. 18A, backboard 600 now provides mechanical stability to the structure comprising backboard 600, control apparatus 480, and LED apparatus 580. The LED substrate can now be removed from this structure. LED substrate 510, shown in FIG. 17 is removed, as shown in FIG. 18A. LED substrate 510 may be removed by a laser process. If LED substrate 510 is sapphire, a KrF Excimer laser with an energy density of 400 mJ/cm$^2$, a wavelength of 248 nm, and a pulse width of 38 ns can irradiate the sapphire surface at an elevated temperature of 60° C. and remove the sapphire substrate from first conductive layer 514 shown in FIG. 18A. LED substrate 510 may be removed by chemical etching. If LED substrate 510 is GaAs, a solution of $NH_4OH:35H_2O$ or a solution of $5H_3PO_4:3H_2O_2:3H_2O$ can be applied to remove the GaAs substrate from first conductive layer 514. If LED substrate 510 is silicon, a solution of KOH, TMAH, HF+$HNO_3$, or HF+$NH_4F$ can be applied to remove LED substrate 510 from first conductive layer 514.

After the LED substrate is removed, surface 515 of first conductive layer 514 may be roughened to enhance light extraction from LED 500. For example, if first conductive layer 514 is GaN or AlGaInN, surface 515 can be roughened by etching in a solution of KOH. If first conductive layer 514 is GaP, AlGaP, or AlGaNInP, a solution of HCl and $H_3PO_4$ can roughen surface 515. If first conductive layer 514 is GaP, a corrosive gas mixture of $BCl_3$, $Cl_2$, and Ar can roughen surface 515. The roughness of surface 515 is exaggerated for clarity. For example, surface 515 may have a root mean square roughness of about 0.2 microns. In other embodiments, first conductive layer 514 is not roughened.

Figure 18B:
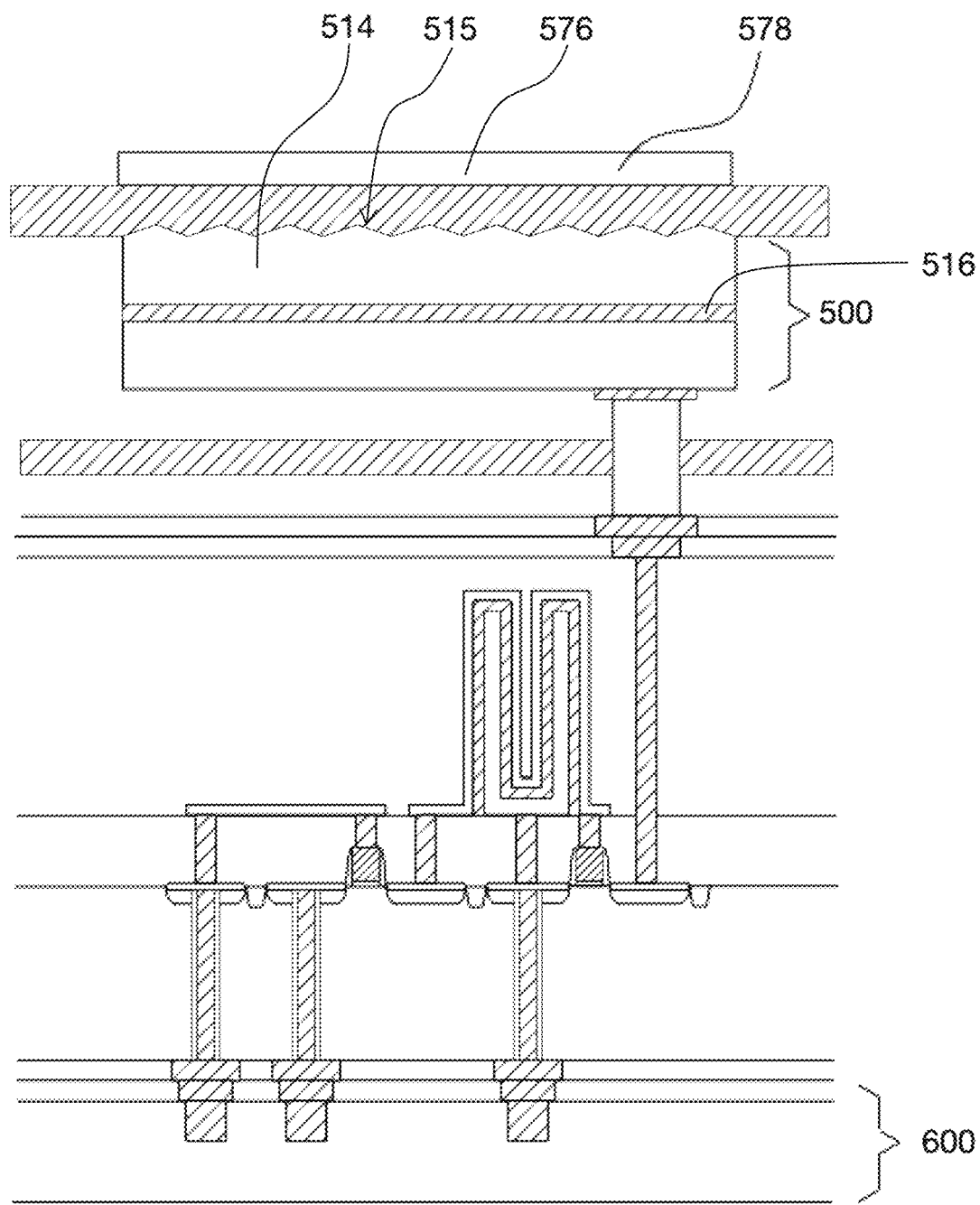
FIG. 18B schematically illustrates a cross-sectional view of the partially fabricated light emitting device after deposition of a transparent conductive layer and a wavelength-converting layer.

Turning to FIG. 18B, a transparent conductive layer 576 is deposited on first conductive layer 514 of LED 500.

Transparent conductive layer 576 may be any suitable material that is substantially transparent to visible light and is relatively conductive to electricity, including but not limited to indium tin oxide (ITO), aluminum zinc oxide (AZO), fluorine-doped tin oxide (FTO), or a stack of a thin nickel layer followed by a thin gold layer. Transparent conductive layer 576 may be deposited by any suitable technique, such as evaporation, CVD, or sputtering, most preferably evaporation. An interconnect (not shown), may connect transparent conductive layer 576 to a backboard interconnect on backboard 600. Transparent conductive layer 576 may be patterned and etched (not shown).

Wavelength-converting layer 578 is next deposited on transparent conductive layer 576. Wavelength-converting layer 578 overlies LED 500. Wavelength-converting layer 578 is excited by the light emitted by the active layer 516 and emits light of a different wavelength than is emitted by active layer 516. In a specific embodiment, wavelength-converting layer 578 may comprise an organic material, for example silicone, epoxy, or polycarbonate, combined with inorganic phosphor particles such as GaAlN, with the GaAlN phosphor particles excited by light with a dominant wavelength of between 420 and 470 nm (blue) and emitting light with a dominant wavelength of between 500 and 550 nm (red). In different embodiment, the phosphor particles may be CaAlSiN:Eu, with CaAlSiN:Eu phosphor particles excited by light with a dominant wavelength of between 420 and 470 nm (blue), and emitting light with a dominant wavelength of between 610 and 730 nm (green). Any suitable phosphor particle may be used. In a different embodiment, silicone, epoxy, or polycarbonate may be combined with quantum dots, the quantum dots being nano-scale semiconductor material, for example group II-VI material having a composition ZnCdMgSe, CdSe, InP, or ZnS. In one embodiment, the composition of the quantum dots can be optimized to emit red (500 to 550 nm) or green (610 to 730 nm) light when excited by blue light (420 to 470 nm). Any suitable quantum dot composition may be used. In one embodiment, wavelength-converting layer 578 may be screen printed into any suitable pattern on the wafer.

In a different embodiment, wavelength-converting layer 578 may be phosphor particles or quantum dots embedded in glass, a technique known as phosphor-in-glass (PiG) or quantum dot-in-glass (QDiG). For example, glass paste combining $SiO_2$, $B_2O_3$, phosphor particles or quantum dots, adhesive, and organic solvent may be screen printed onto transparent conductive layer 576. The screen printing may be done with a stencil pattern or without patterning. Volatile organic components of the glass paste may be removed by drying at 150° C. and sintering at 600° C. In a different embodiment, the PiG or QDiG layer may be deposited by a spin-on technique, in which chemicals and phosphor particles or quantum dots are suspended in organic solvents. The solution is spun onto transparent conductive layer 576 as a film. The film is dried and annealed, which substantially removes the organic materials, leaving a glass film with phosphor particles or quantum dots. The glass film with phosphor particles or quantum dots is wavelength-converting layer 578. If the wavelength-converting layer 578 was not initially patterned during deposition, a masking layer (not shown) can be applied, patterned, and wavelength-converting layer 578 etched to form a pattern. Wavelength-converting layer 578 may be etched by any suitable etchant, including but not limited to acids or corrosive gases. The masking layer is removed.

Figure 19A:
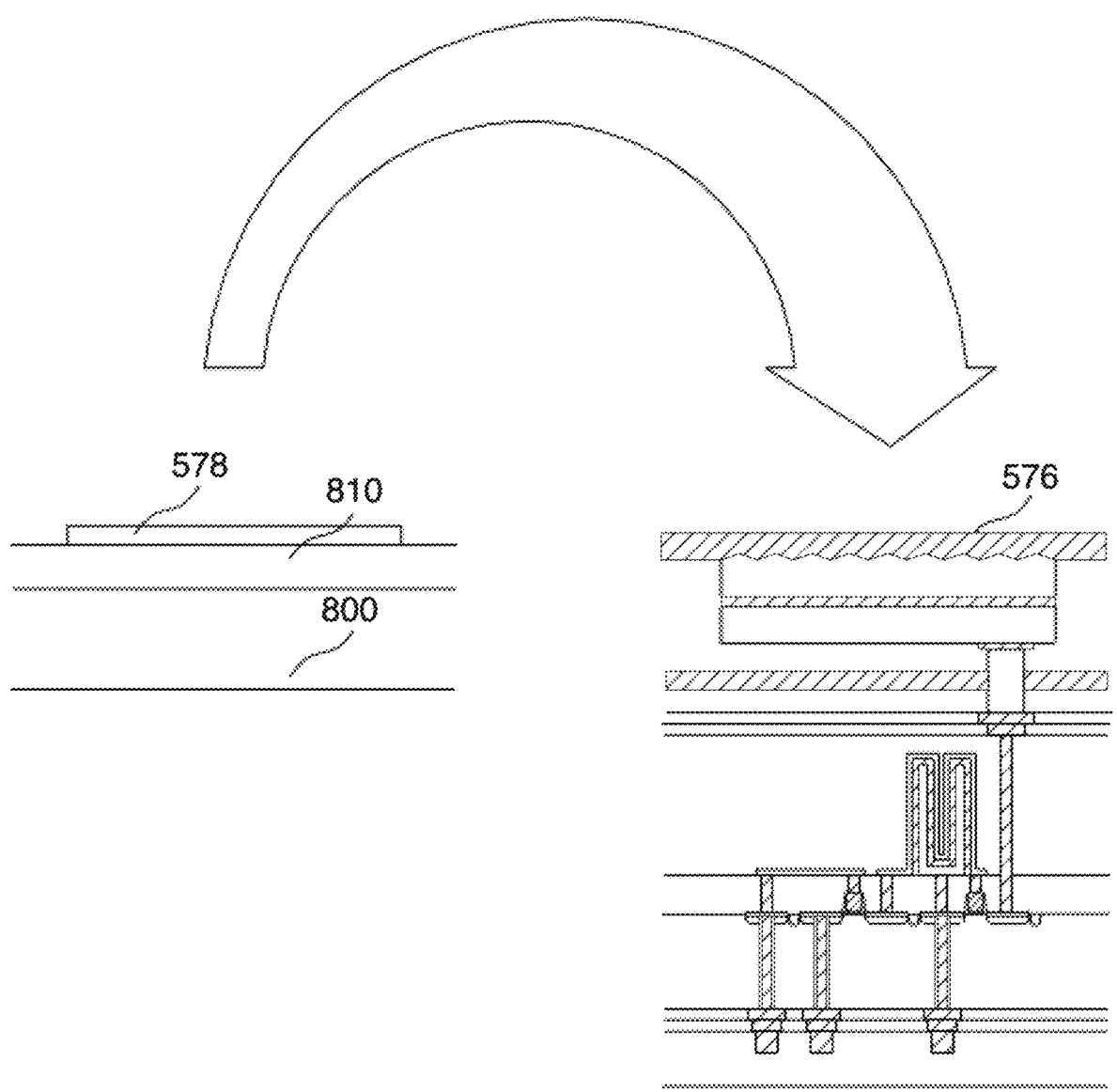
FIG. 19A schematically illustrates a cross-sectional view the action of flipping a wavelength-converting layer comprising a MQW layer with substrate and bonding to the transparent conductive layer of an LED.
Figure 19B:
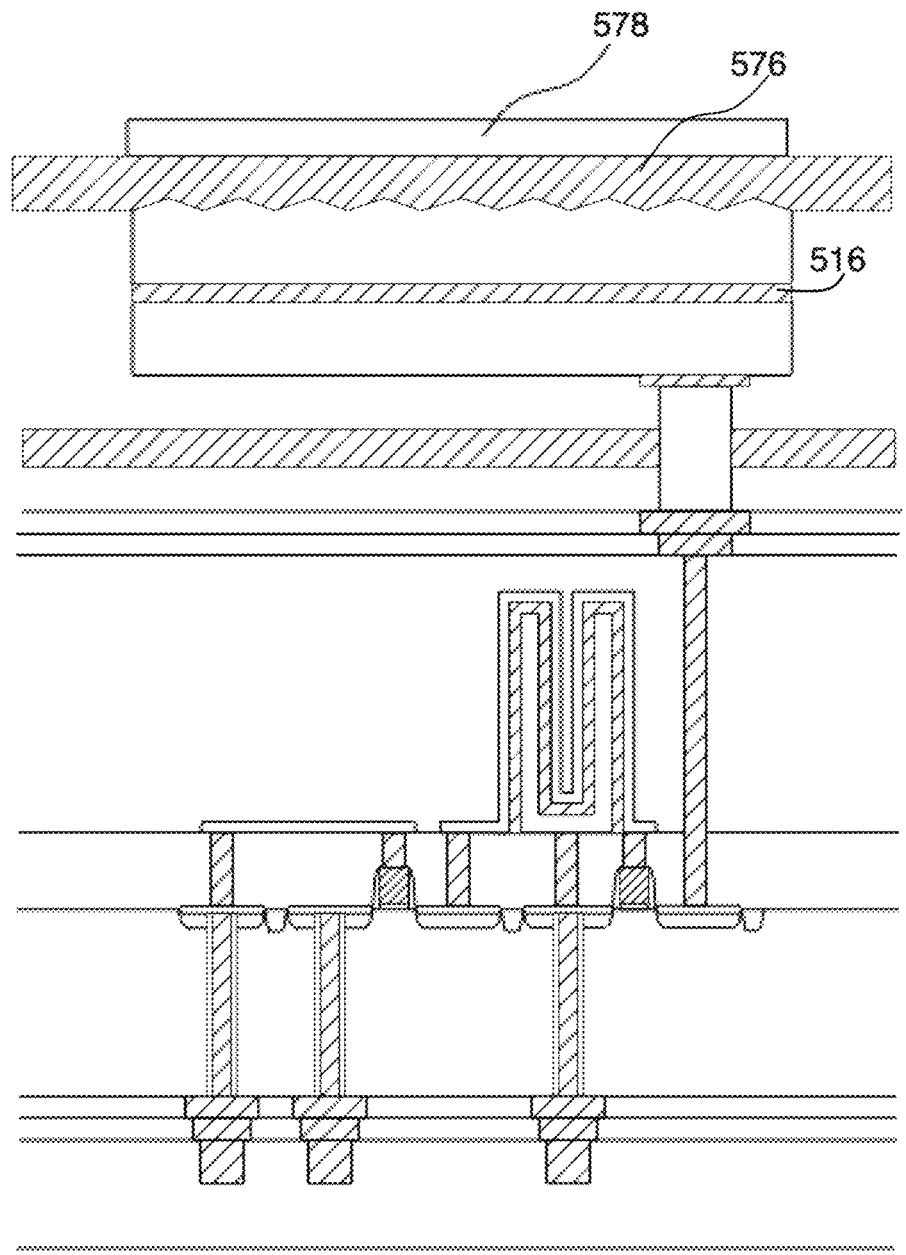
FIG. 19B schematically illustrates a cross-sectional view of the LED apparatus+control apparatus+MQW layer, after removal of MQW substrate.

Turning to FIG. 19A, in yet another embodiment, wavelength-converting layer 578 may comprise multiple quantum wells (MQWs). Quantum wells are two dimensional films of inorganic semiconductors, and comprise pairs of alternating films of different materials, for example, ZnCdSe/ZnSe, ZnCdSe/ZnCdMgSe, InGaN/GaN, AlGaN-InP/GaNInP, or any suitable pairing. Wavelength-converting layer 578 comprising MQWs of GaInN/GaN are grown on a thick n-type GaN layer 810 on a sapphire substrate 800. Wavelength-converting layer 578, GaN layer 810, and sapphire substrate 800 are flipped over and wavelength-converting layer 578 is bonded to transparent conductive layer 576, as shown in FIG. 19B. GaN layer 810 and sapphire substrate 800 are then removed by similar substrate removal techniques as described earlier. Wavelength-converting layer 578 can be patterned (not shown) and etched, either before or after bonding to the structure comprising the LED. In one example, GaInN/GaN MQW films in wavelength-converting layer 578 absorb blue light from active layer 516 and emit green light. In another example, AlGaNInP/GaN-InP MQW films in wavelength-converting layer 578 absorb blue light from active layer 516 and emit red light.

Figure 19C:
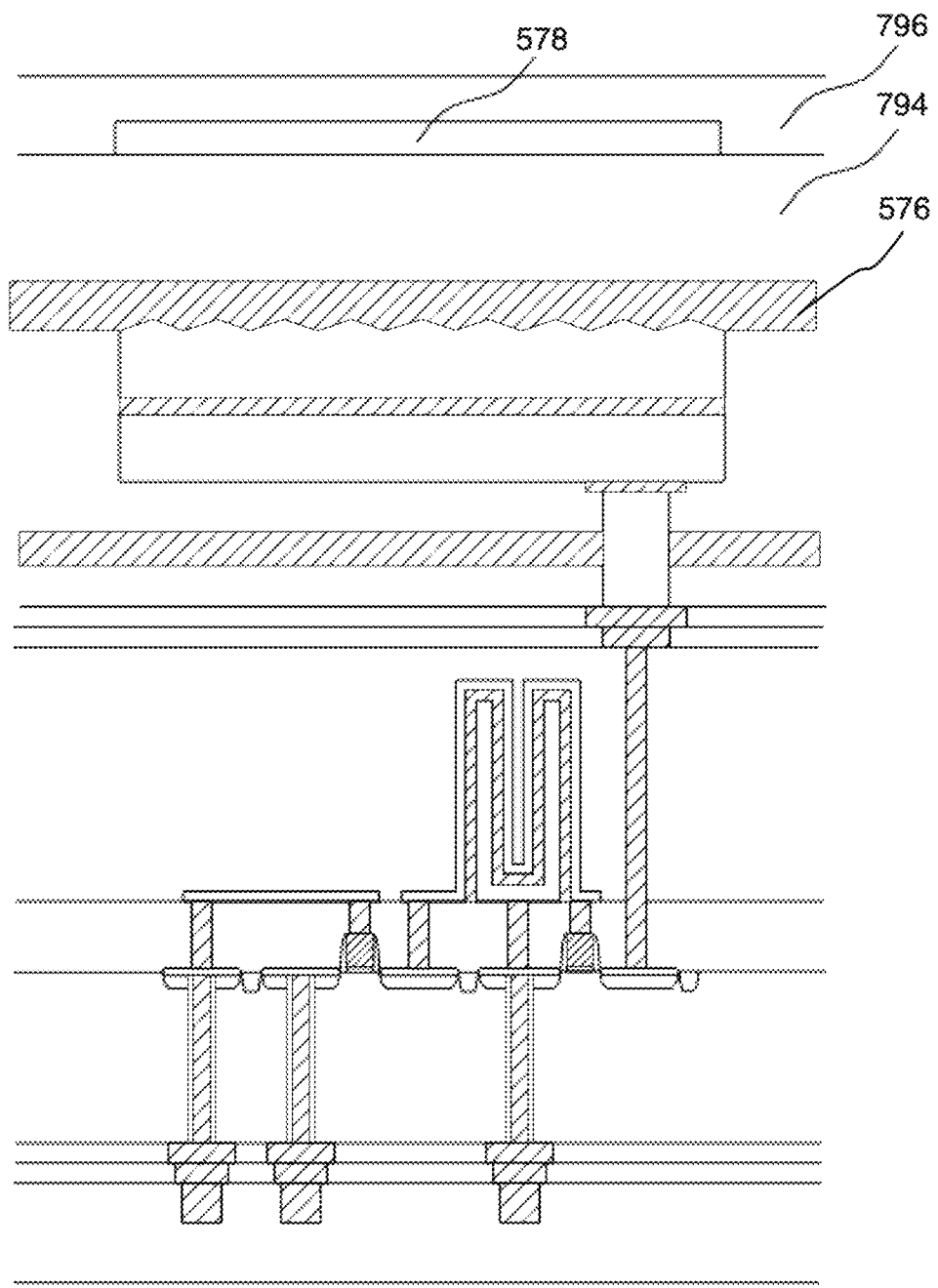
FIG. 19C schematically illustrates a cross-sectional view of partially fabricated light emitting device with a dielectric layer in between the wavelength-converting layer and LED.

In another embodiment shown in FIG. 19C, a tenth dielectric layer 794 can be disposed between transparent conductive layer 576 and wavelength-converting layer 578. Tenth dielectric layer 794 may have better adhesion to subsequently bonded wavelength-converting layer 578 compared with transparent conductive layer 576. Tenth dielectric layer 794 may any suitable material, including but not limited to silicon oxide, silicon nitride, aluminum oxide, or titanium oxide. A passivating layer 796 is deposited on wavelength-converting layer 578. Passivating layer 796 protects the light emitting device from moisture intrusion and/or mobile ions which might degrade it. Passivating layer 796 can be any suitable material which is substantially transparent to light of the wavelength emitted by the active layer of the LED and/or the wavelength emitted by the wavelength-converting layer 578. If wavelength-converting layer 578 contains organic materials, which are sensitive to elevated temperature, passivating layer 796 can be an organic material, including but not limited to silicone, epoxy, or polycarbonate. Use of an organic material for passivating layer 796 can avoid high temperature processing that could compromise wavelength-converting layer 578 if wavelength-converting layer 578 was organic. If wavelength-converting layer 578 is PiG or QDiG, both of which are less sensitive to elevated temperature than an organic material such as silicone, epoxy, or polycarbonate, then passivating layer 796 may comprise either an organic layer such as silicone, epoxy, or polycarbonate or an inorganic dielectric material such silicon oxide, silicon nitride, aluminum oxide, or titanium oxide. The inorganic dielectric material for passivating layer 796 can be deposited by any suitable method, including evaporation, sputtering, or CVD, most preferably CVD. If passivating layer 796 is silicon oxide, it may have a thickness between 0.02 and 10 microns thick, for example about 0.5 microns. A passivating layer may also be deposited on wavelength-converting layer 576 in FIG. 19B, although it is not shown.

Summarizing, a method for forming a light emitting device comprises the following steps: providing a transistor substrate having a top surface and bottom surface and the top surface comprising a plurality of conductive regions; forming two transistors in the top surface of the transistor substrate and a capacitor; providing an LED substrate, and forming an LED on the LED substrate wherein the LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof; forming a reflector layer; bonding the two transistors and capacitor to the LED, wherein after bonding the reflector layer is disposed between the LED and the two transistors and capacitor, the LED is in operative communication with one of the two transistors, and the LED overlies the two transistors and capacitor; removing a portion of the transistor substrate; and forming a plurality of through substrate interconnects, wherein each through substrate interconnect extends through the transistor substrate from a conductive region of the plurality of conductive regions to the bottom surface of the transistor substrate.

II. Light Emitting Assembly

Some embodiments of light emitting assemblies comprising a plurality of light emitting devices will now be described. The finished assembly may be diced from an even larger plurality of light emitting devices. The light emitting assembly will be fabricated using one LED substrate and one transistor substrate with a plurality of LED apparatus and a plurality of control apparatus on each, respectively. There are many possible shapes and configurations, and only two examples are shown, without limitation of the present invention. Fabrication of the assembly of light emitting devices occurs similar to the description in the previous section for a single light emitting device, with some difference in the wavelength-converting layers.

Figure 20A:
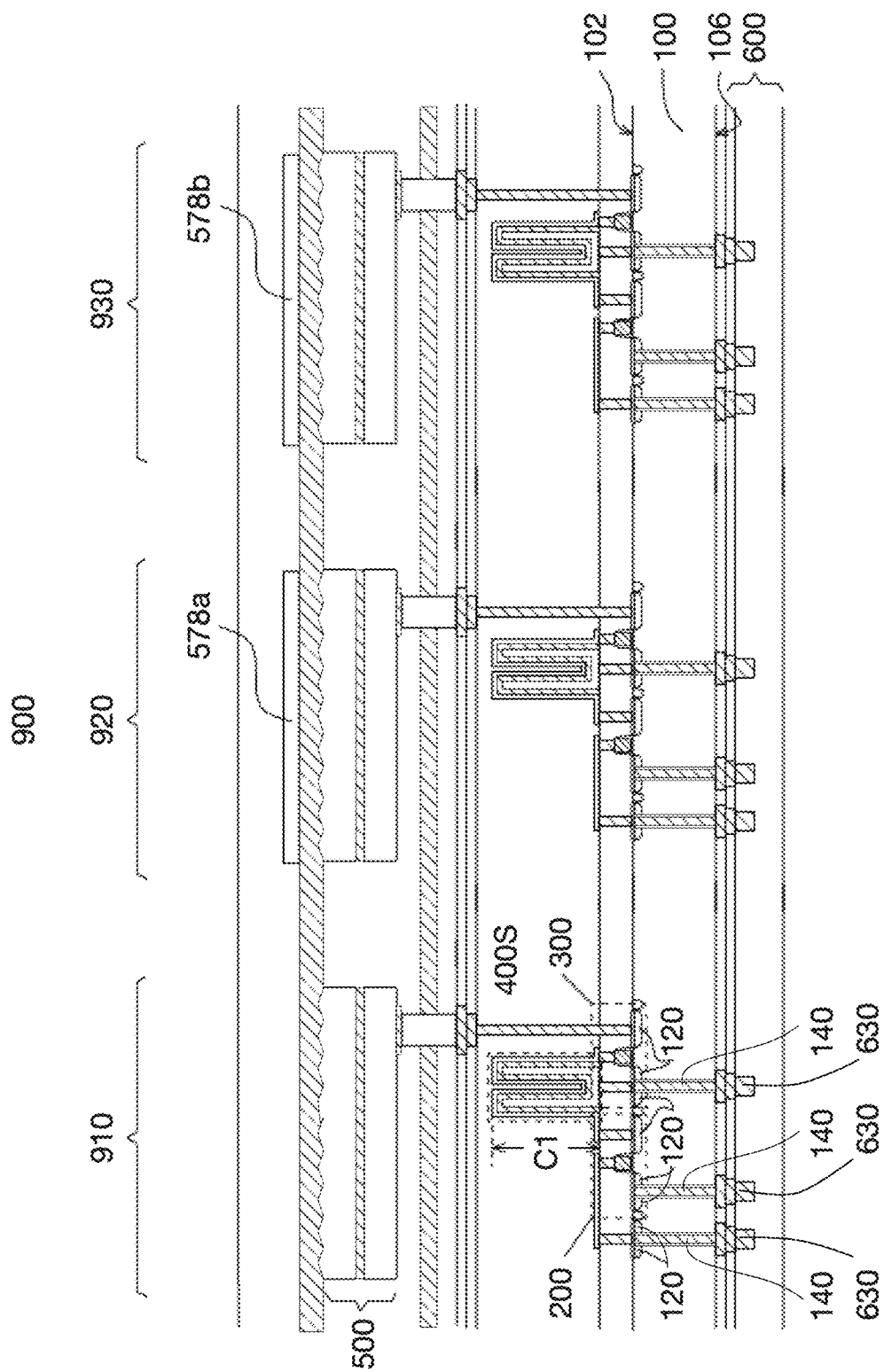
FIG. 20A schematically illustrates a cross-sectional view of an embodiment of an assembly of light emitting devices.

One embodiment of a light emitting assembly is shown in cross-sectional schematic in FIG. 20A. Assembly 900 has three light emitting devices 910, 920, and 930. It is to be understood there may be many more light emitting devices in the assembly than shown in the FIG. 20A. Although the light emitting devices 910, 920, and 930 are shown with the same size, they may each have a different size in other assembly embodiments. For example, the LEDs may of different sizes to allow for more efficient production of combined light output of the assembly. Assembly 900 has a transistor substrate 100 having a top surface 102 and a bottom surface 106, and a plurality of conductive regions 120. Light emitting device 910 is now described in more detail, although it is to be understood that this description can generally apply to any of the light emitting devices. Light emitting device 910 has a plurality of through substrate interconnects 140 which extend through transistor substrate 100 from conductive regions 120 to the bottom surface 106 of transistor substrate 100. Light emitting device 910 has a first transistor 200 and a second transistor 300 formed in the top surface 102 of transistor substrate 100. Light emitting device 910 has a capacitor 400S, with a longest dimension C1 that is substantially orthogonal to top surface 102 of transistor substrate 100. Capacitor 400S is in operative communication with first transistor 200 and second transistor 300. Light emitting device 910 has an LED 500, with a largest area which overlies transistors 200 and 300 and capacitor 400S. Light-emitting devices 920 and 930, each have wavelength-converting layers 578a and 578b, respectively. In one example, first wavelength converting layer 578a emits light with a dominant wavelength between 500 and 580 nm, and second wavelength converting layer 578b emits light with a dominant wavelength between 610 and 730 nm. Assembly 900 further comprises a backboard 600. Backboard 600 comprises backboard interconnects 630. Backboard 600 provides mechanical stability and electrical connections to other devices. Backboard 600 may comprise a PCB or interposer. As previously discussed, the smoother surface of an interposer compared to a PCB allows for the patterning by lithography of finer features, and an interposer is preferred for this reason.

The active layer of each LED in this example may emit light of substantially the same dominant wavelength, for example, light with dominant wavelength 420 to 470 nm (blue). In the embodiment shown in FIG. 20A, LED 500 of light emitting device 910 does not have a wavelength-converting layer overlying the LED, and light emitting device 910 will emit light of the same dominant wavelength as the active layer of LED 500. Light emitting device 920 has wavelength-converting layer 578a overlying it. First wavelength-converting layer 578a of light emitting device 910 may absorb light with dominant wavelength of between 420 and 470 nm (blue) and emit light with a dominant wavelength of between 500 and 550 nm (red). Light emitting device 930 has a second wavelength-converting layer 578b overlying the LED. Second wavelength-converting layer 578b of light emitting device 930 may absorb light with dominant wavelength of between 420 and 470 nm (blue) and emit light with a dominant wavelength of between 610 to 730 nm (green). In this embodiment, assembly 900 of light emitting devices may emit red, green, or blue light, or combinations of these light colors. Assembly 900 may comprise a pixel in a color display with light emitting devices 910, 920, and 930 as subpixels. In other embodiments, an assembly of three light emitting devices may emit cyan, magenta, or yellow, respectively, to form a pixel in a different color display. In a different embodiment (not shown), an assembly of light emitting devices would not have any wavelength-converting layers overlying them, and each light emitting device would emit light of the same dominant wavelength, suitable for use in a monochromatic display. The arrangement of light emitting devices and wavelength-converting layers in an assembly may be accomplished in any suitable manner. There may be one, two, three or more different kinds of wavelength-converting layers in an assembly that emit one, two, three, or more different wavelengths of light.

Summarizing, a light emitting assembly 900 has transistor substrate 100 having a top surface 102 and a bottom surface 106. There is a plurality of conductive regions 120 in top surface 102 of transistor substrate 100. Light emitting assembly 900 has a plurality of light emitting devices 910, 920, and 930. By example, light emitting device 910 comprises a plurality of through substrate interconnects 140, wherein each through substrate interconnect extends through transistor substrate 100 from one of the conductive regions 120 to bottom surface 106 of the transistor substrate 100. Light emitting device 910 also comprises a first transistor 200 and a second transistor 300 formed in top surface 102 of transistor substrate 100. Light emitting device 910 also comprises capacitor 400S with longest dimension C1 substantially orthogonal to top surface 102 of transistor substrate 100. Capacitor 400S is in operative communication with first transistor 200 and second transistor 300. Light emitting device 910 also comprises LED 500, which has a largest area overlying first transistor 200, second transistor 300, and capacitor 400S. LED 500 is in operative communication with either first transistor 200 or second transistor 300. Light emitting assembly 900 also comprises a plurality of wavelength-converting layers. There is at least a first wavelength-converting layer 578a that emits light with a dominant wavelength of between 500 and 550 nm and a second wavelength-converting layer 578b that emits light with a dominant wavelength of between 610 and 730 nm.

Light emitting assembly 900 also comprises backboard 600 wherein the backboard may comprise an interposer.

Figure 20B:
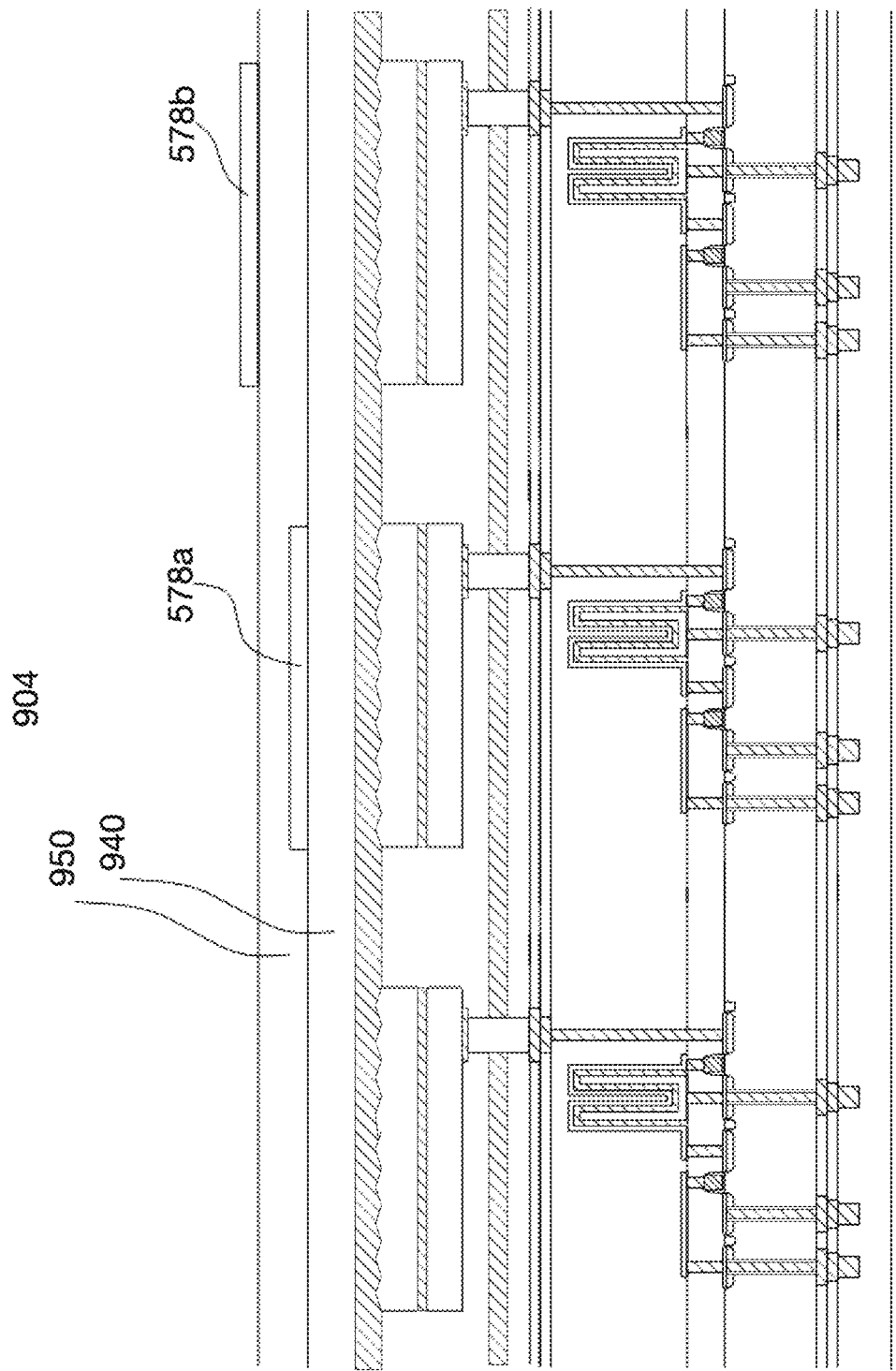
FIG. 20B schematically illustrates a cross-sectional view of an embodiment of an assembly of light emitting devices.

Referring to FIG. 20B, another embodiment of an assembly of light emitting devices 904 is shown in cross-sectional schematic. In this embodiment, first and second wavelength-converting layers 578a and 578b, respectively, are disposed on different dielectric layers overlying the LEDs. First wavelength-converting layer 578a is disposed on a dielectric layer 940 and second wavelength-converting layer 578b is disposed on a dielectric layer 950. In this manner, each wavelength-converting layer may be fabricated and partitioned from different wavelength-converting layers. In other embodiments, there may be even more dielectric and wavelength-converting layers than shown in FIG. 20B. Any suitable light emitting device, such as those described in FIGS. 5-8, may be used in the assembly.

What is claimed is:

1. A light emitting device comprising:
   a transistor substrate having a top surface and a bottom surface, wherein the top surface comprises a plurality of conductive regions;
   a plurality of through substrate interconnects, wherein each through substrate interconnect of the plurality extends through the transistor substrate from one of the conductive regions of the plurality of conductive regions to the bottom surface of the transistor substrate;
   a first transistor, wherein the first transistor is formed in the top surface of the transistor substrate;
   a second transistor, wherein the second transistor is formed in the top surface of the transistor substrate;
   a capacitor, wherein the longest dimension of the capacitor is substantially orthogonal to the top surface of the transistor substrate and wherein the capacitor is in operative communication with the first transistor and the second transistor;
   an LED having a largest area, wherein the LED overlies the first transistor, the second transistor, and the capacitor, wherein the LED comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof, and wherein the LED is in operative communication with either the first transistor or the second transistor; and
   a backboard wherein the backboard comprises a plurality of backboard interconnects, wherein at least one of the backboard interconnects is connected electrically to the first transistor.

2. The light emitting device of claim 1, wherein the capacitor is a stack capacitor disposed between either the first transistor or the second transistor and the LED.

3. The light emitting device of claim 1, wherein the capacitor is a trench capacitor and wherein at least a portion of the trench capacitor is disposed between the top surface and the bottom surface of the transistor substrate.

4. The light emitting device of claim 1, further comprising a reflector layer, wherein the reflector layer is disposed between the LED and the transistor substrate.

5. The light emitting device of claim 4, wherein the reflector layer comprises a distributed Bragg reflector.

6. The light emitting device of claim 1, further comprising a wavelength-converting layer, wherein the wavelength-converting layer overlies the LED.

7. The light emitting device of claim 6, wherein the wavelength-converting layer comprises quantum dots.

8. The light emitting device of claim 6, wherein the wavelength-converting layer comprises quantum wells.

9. The light emitting device of claim 1, wherein the backboard comprises an interposer.

10. The light emitting device of claim 1, wherein the transistor substrate comprises single crystal silicon.

11. The light emitting device of claim 1, wherein at least some of the conductive regions further comprise a silicide layer.

12. The light emitting device of claim 1, wherein the transistor substrate has a thickness, and wherein the thickness is less than 20 microns.

13. The light emitting device of claim 1, wherein the largest area of the LED is 2,500 square microns or less.

14. The light emitting device of claim 1, wherein the largest area of the LED is 100 square microns or less.

15. A light emitting assembly comprising:
   a) a transistor substrate having a top surface and a bottom surface, wherein the top surface comprises a plurality of conductive regions;
   b) a plurality of light emitting devices, wherein each light emitting device comprises:
      i) a plurality of through substrate interconnects, wherein each through substrate interconnect of the plurality extends through the transistor substrate from one of the conductive regions of the plurality of conductive regions to the bottom surface of the transistor substrate,
      ii) a first transistor, wherein the first transistor is formed in the top surface of the transistor substrate,
      iii) a second transistor, wherein the second transistor is formed in the top surface of the transistor substrate,
      iv) a capacitor, wherein the longest dimension of the capacitor is substantially orthogonal to the top surface of the transistor substrate and wherein the capacitor is in operative communication with the first transistor and the second transistor, and
      v) an LED having a largest area, wherein the LED overlies the first transistor, the second transistor, and the capacitor, wherein the LED comprises inorganic materials, and wherein the LED is in operative communication with either the first transistor or the second transistor;
   c) a plurality of wavelength-converting layers, wherein the plurality of wavelength-converting layers comprises at least a first wavelength-converting layer that emits light with a dominant wavelength between 500 and 550 nm and a second wavelength-converting layer that emits light with a dominant wavelength between 610 and 730 nm; and
   d) a backboard, wherein the backboard comprises a plurality of backboard interconnects.

16. The light emitting assembly of claim 15, wherein each capacitor of the plurality of light emitting devices is a stack capacitor disposed between either the first transistor or the second transistor and the LED.

17. The light emitting assembly of claim 15, wherein each capacitor of the plurality of light emitting devices is a trench capacitor and wherein at least a portion of the trench capacitor is disposed between the top surface and the bottom surface of the transistor substrate.

18. The light emitting assembly of claim 15, wherein each LED of the plurality of light emitting devices comprises gallium nitride, indium gallium nitride, indium arsenide, aluminum gallium arsenide, gallium arsenide, gallium phosphide, gallium arsenide phosphide, aluminum indium gallium phosphide, gallium arsenide nitride, aluminum indium arsenide, aluminum antimonide, indium phosphide, indium antimonide, or indium gallium arsenide phosphide, and combinations thereof.

19. The light emitting assembly of claim 15, wherein each light emitting device of the plurality of light emitting devices further comprises a reflector layer, wherein the reflector layer is disposed between the LED and the transistor substrate.

20. The light emitting assembly of claim 19, wherein the reflector layer comprises a distributed Bragg reflector.

21. The light emitting assembly of claim 15, wherein the plurality of wavelength-converting layers comprises quantum dots.

22. The light emitting assembly of claim 15, wherein the plurality of wavelength-converting layers comprises quantum wells.

23. The light emitting assembly of claim 15, wherein at least some of the conductive regions further comprise a silicide layer.

24. The light emitting assembly of claim 15, wherein the backboard comprises an interposer.

25. The light emitting assembly of claim 15, wherein the transistor substrate comprises single crystal silicon.

26. The light emitting assembly of claim 15, wherein the transistor substrate has a thickness, and wherein the thickness is less than 20 microns.

27. The light emitting assembly of claim 15, wherein the largest area of at least one LED of the plurality of LEDs is 2,500 square microns or less.

28. The light emitting assembly of claim 15, wherein the largest area of at least one LED of the plurality of LEDs is 100 square microns or less.

* * * * *